United States Patent [19]

Kobayashi et al.

[11] Patent Number: 5,227,329
[45] Date of Patent: Jul. 13, 1993

[54] METHOD OF MANUFACTURING SEMICONDUCTOR DEVICE

[75] Inventors: Takashi Kobayashi, Kokubunji; Shimpei Iijima, Akishima; Atsushi Hiraiwa, Higashi-Murayama; Nobuyoshi Kobayashi, Kawagoe; Takashi Hashimoto, Hachiohji; Mitsuo Nanba, Hinode, all of Japan

[73] Assignee: Hitachi, Ltd., Tokyo, Japan

[21] Appl. No.: 753,650

[22] Filed: Aug. 30, 1991

[30] Foreign Application Priority Data

Aug. 31, 1990 [JP] Japan .................. 2-228124

[51] Int. Cl.⁵ .......................................... H01L 21/20
[52] U.S. Cl. ................................ 437/101; 437/160; 437/186; 437/950; 148/DIG. 144
[58] Field of Search ............... 437/186, 101, 160, 162, 437/950; 148/DIG. 144

[56] References Cited

U.S. PATENT DOCUMENTS

| | | | |
|---|---|---|---|
| 3,664,896 | 5/1972 | Duncan | 437/147 |
| 4,648,175 | 3/1987 | Metz, Jr. et al. | 437/193 |
| 4,696,702 | 9/1987 | Ellis, Jr. et al. | 437/88 |
| 4,751,101 | 6/1988 | Joshi | 437/173 |
| 4,988,632 | 1/1991 | Pfiester | 437/27 |

FOREIGN PATENT DOCUMENTS 0245131  12/1985  Japan .

OTHER PUBLICATIONS

Nakayama et al., "Boron Doping Effect on Silicon Film Deposition in the $Si_2H_6$—$B_2H_6$—He Gas System"; J. Electrochem. Soc: Solid-State Science and Technology, vol. 133, No. 8, pp. 1721-1724, Aug. 1986.
Sze, "VLSI Technology", 1988, pp. 499-507.

Primary Examiner—Brian E. Hearn
Assistant Examiner—Trung Dang
Attorney, Agent, or Firm—Antonelli, Terry, Stout & Kraus

[57] ABSTRACT

A boron doped amorphous silicon film is formed by CVD under the conditions of a pressure lower than 1 atm and a temperature higher than 200° C. and lower than 400° C. by using at least one of disilane and trisilane, and diborane as source gases. Since the resultant amorphous silicon film can diffuse impurities at a lower temperature than in the case of the polycrystalline silicon film formed by the conventional method, a pn junction much shallower than in the prior art can be formed.

12 Claims, 19 Drawing Sheets

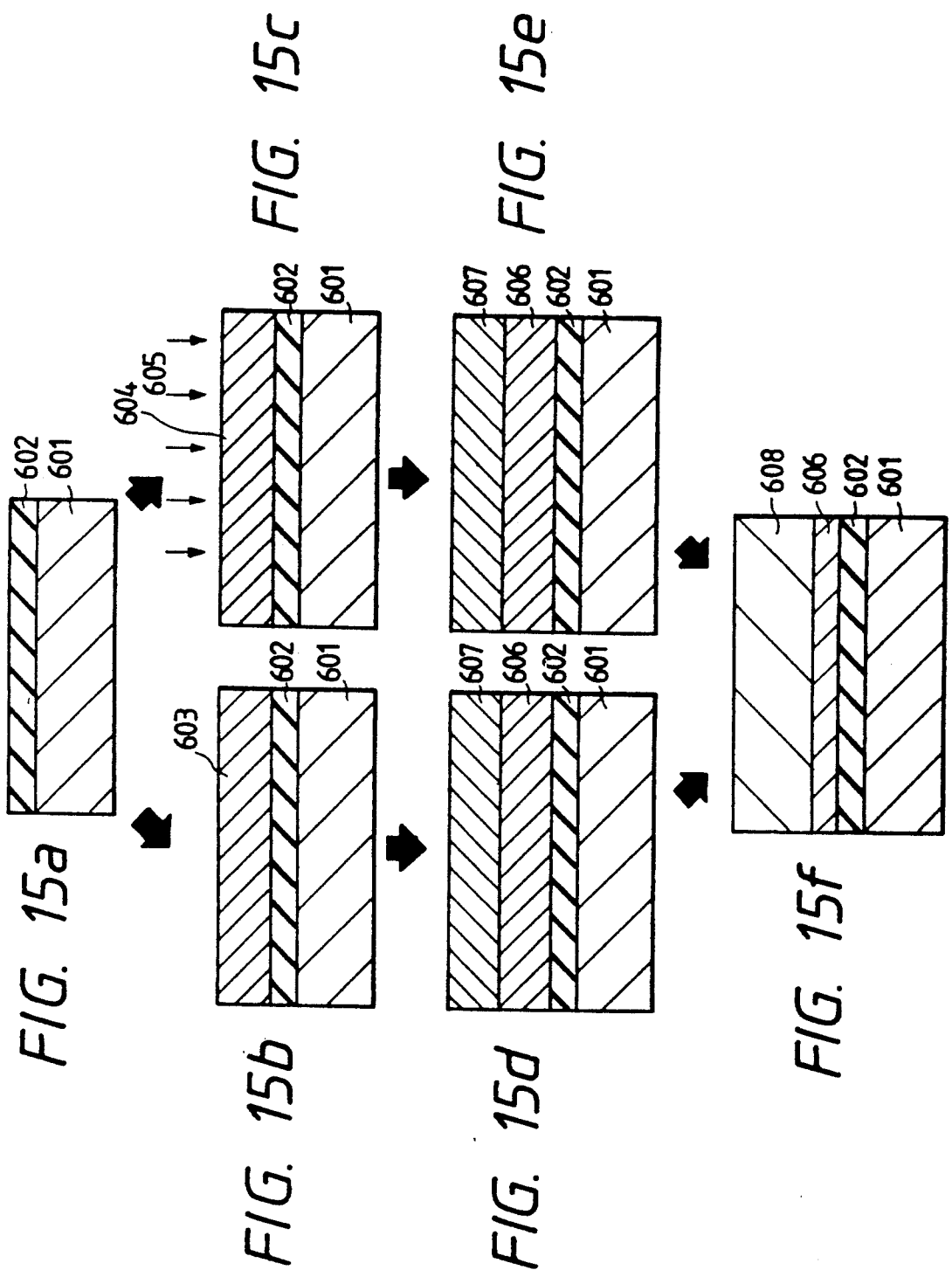

METHOD OF MANUFACTURING SEMICONDUCTOR DEVICE

BACKGROUND OF THE INVENTION

The present Invention concerns a method of manufacturing a semiconductor device and, more particularly, it relates to a method of manufacturing a semiconductor device capable of forming electrodes or wirings of excellent step coverage at a low temperature.

Polycrystalline silicon (Si) films formed by thermal decomposition of silane (SiH$_4$) through a low pressure chemical vapor deposition (LPCVD) method have been generally utilized for electrodes and wirings in semiconductor devices. Since the polycrystalline Si film formed by the LPCVD method has extremely high resistivity, impurities are doped by well-known thermal diffusion or ion implantation to lower the resistivity and provide an electroconductivity in the subsequent step.

In the manufacture of a bipolar transistor, an opening reaching as far as an Si substrate is formed in a dielectric film formed on the Si substrate, a polycrystalline Si film is then deposited, to which impurities are doped by the ion implantation and, subsequently, the impurities in the polycrystalline Si film are diffused to the Si substrate by a heat treatment to form an emitter. The techniques relevant to the method of this kind, is discussed, for example, in VLSI Technology, S.M.Sze, ed (McGraw-Hill, 1988 pp 499-507).

However, in a case of forming the emitter of a pnp bipolar transistor by implantation of boron ions or boron difluoride (BF$_2$) ions into the polycrystalline Si film, a heat treatment at a high temperature of higher than 900° C. is required for activating boron in the polycrystalline Si film and boron of a large diffusivity is diffused over a long distance making it difficult to form a shallower junction. As a result, there has been a problem that the operation speed of the pnp transistor cannot be improved.

Further, along with the down scaling for LSI, the aspect ratio in the opening for forming the emitter is increased and, in a case of ion implantation to the polycrystalline Si film in the opening having such an abrupt side wall, a portion lacking in boron is formed in the polycrystalline Si film thereby bringing about a problem that the resistivity of electrodes or wirings is increased.

On the other hand, in a case of doping impurities by a thermal diffusion, it is possible to dope the impurities also on the steep stepped side walls by applying a thermal diffusion at a high temperature for a long period of time. However, similar to the case of the ion implantation described above, boron is diffused over a long distance in the portion of the Si substrate in which the polycrystalline Si film is in contact with an Si substrate such as an emitter, making it difficult to form a shallower junction.

As a method of doping boron to the polycrystalline Si film formed on the side walls of the opening as one of the foregoing problems, has also been proposed a method of using disilane (Si$_2$H$_6$) and diborane (B$_2$H$_6$) as source gases and depositing an Si film while doping boron within a temperature range of 520° C.-665° C. (J. Electrochem. Soc: SOLID-STATE SCIENCE AND TECHNOLOGY, Vol. 133, No. 8, pp 1721-1724, August 1986). However, according to the experiment made by the present inventors, the deposited Si film within such a temperature range by using Si$_2$H$_6$ as the source gas brings about a problem that it is poor in the step coverage and the layer thickness on the side wall of the groove is remarkably reduced as compared with the upper surface upon deposition in a deep groove. Further, it has also been found that the deposition reaction of the film is too violent to be controlled within the temperature range of 400° to 600° C.

SUMMARY OF THE INVENTION

An object of the present invention is to overcome the foregoing problems in the prior art and provide a method of manufacturing a semiconductor device capable of easily forming satisfactory electrodes or wirings of excellent step coverage capable of completely burying the inside of a deep groove or an opening of a large aspect ratio.

Another object of the present invention is to provide a method of manufacturing a semiconductor device capable of easily forming an extremely shallow junction.

For attaining the foregoing objects, in accordance with the present invention, a boron doped amorphous Si film is formed at a temperature range higher than 200° C. and lower than 400° C. by a low pressure CVD (CVD conducted at a gas pressure lower than 1 atm) using a gas mixture comprising diborane (B$_2$H$_6$) and at least one of disilane (Si$_2$H$_6$) and trisilane (Si$_3$H$_6$) as source gases.

The thus formed amorphous Si film is excellent in the step coverage and can completely fill even in a deep groove.

This is assumed to be due to the following reasons. At a temperature higher than about 400° C., Si$_2$H$_6$ is decomposed in a gas phase by the following reaction:

$$\mathrm{Si_2H_6(g) \rightarrow SiH_2(g) + SiH_4(g)} \qquad (1)$$

to form SiH$_2$ (silylene). Since SiH$_2$ is highly reactive, it reacts with a substrate directly after the decomposition to deposit an Si film. As a result, the film deposition reaction is controlled by the feed rate of SiH$_2$. On the side wall of a deep step and in the groove, supply of SiH$_2$ becomes insufficient as compared with that for a flat portion, so that step coverage is deteriorated. An inert gas or a doping gas forming an n-type dopant (for example, phosphine (PH$_3$) or arsine (AH$_3$)) has lower sticking probability to the substrate as compared with SiH$_2$ and gives no effect on the reaction of the formula (1). Accordingly, if such a gas is introduced together with Si$_2$H$_6$ into a reaction vessel, it scarcely changes the deposition rate of the Si film and the step coverage is also poor.

On the other hand, B$_2$H$_6$ has a low decomposing temperature and reacts with the substrate already at a temperature of higher than about 200° C. to form adsorption species. Since the adsorption species readily react with Si$_2$H$_6$, the Si film deposition reaction proceeds even at a temperature of lower than 400° C. Since the reaction is an utterly surface reaction, it does not cause deterioration in the step coverage as in the case of not containing impurities or flowing the n-type doping gas simultaneously and the film can be deposited uniformly even within a deep groove.

By the plasma CVD process, using B$_2$H$_6$ and at least either one of SiH$_4$ or Si$_2$H$_6$ as source gases, it is possible to deposit an Si film at a temperature equal to or lower than that in the present invention. However, the film formed by the plasma CVD process has a poor step coverage and, when buried in a deep groove, results in voids. Accordingly, if the plasma CVD process is employed for the formation of the Si film, it is difficult to completely bury the inside of a deep groove even if the starting source gases are identical.

In the present invention, the Si film is amorphous in the state as it is deposited. When it is applied with a heat treatment, for example, in a nitrogen or inert atmosphere at about 650° C. for about 15 min, dendrites are grown and, at the same time, activation of impurities is completed to obtain a sufficient electroconductivity. Accordingly, remarkable temperature lowering can be attained in a process for forming electrodes or wirings made of polycrystalline Si which was conducted so far at a temperature higher than about 900° C. When the Si film obtained in accordance with the present invention is used as an impurity diffusion source for forming a p-type emitter of a bipolar transistor, it is particularly preferred since an extremely shallow base-emitter junction can be formed to attain an improved operation speed for LSI. Further, when the Si film formed in accordance with the present invention is applied to the formation of a MOS transistor, since a shallow P-type source-drain diffusion layer can be formed, even a minute transistor of a short gate length can also be operated stably. Accordingly, it has an effect also for the large scale of integration of LSI. The average grain size of the Si film formed in accordance with the present invention is greater than the film thickness, which is one order of magnitude greater than that of the polycrystalline Si film prepared by the existent method. Accordingly, the carrier mobility is great and there is also an advantageous effect capable of obtaining a high electroconductivity even if the boron concentration is lowered.

Since the Si film formed in accordance with the present invention is excellent in the step coverage, the inside of a deep contact hole can be buried completely. Accordingly, after filling the Si film into the contact hole in accordance with the present invention, when it is reacted as a reducing agent with a tungsten (W)-containing compound gas to substitute the Si film for a tungsten film, the contact hole can be filled with tungsten to form a multi level interconnection with a low resistivity. In the present invention, since the temperature upon depositing the Si film is lower than 400° C., the present invention can be practiced even when low melting point wiring material such as an aluminum alloy is present in the underlying layer.

The reaction for substituting the Si film for a tungsten film is shown by the formula (2).

$$2WF_6(g) + 3Si(s) \rightarrow 2W(s) + 3SiF_4(g) \quad (2)$$

In the reaction shown by the formula (2), the tungsten film is formed corresponding to the shape of the Si film while consuming the Si film and, in this meaning, an expression "substitution" is adopted in the present specification. Accordingly, in the reaction shown by the formula (2), when all the Si film is exhausted as the reducing agent, the tungsten substitution reaction is terminated spontaneously. Thus, tungsten is not deposited at a position where SI film is not present. When the Si film formed by the present invention is substituted for the tungsten film, since boron is doped in the Si film, it has been observed that a little amount of Si and boron is present in the tungsten film after substitution.

In the substitution of the Si film for the tungsten film, when a thin tungsten film is formed over the entire surface of the Si film at the initial stage of the reaction, the proceeding of the reaction between $WF_6$ and Si in the direction of the film thickness (depth) is made extremely slower and, at last, the reaction is terminated in a portion where the Si film is extremely thin. Accordingly, in a case of forming a thick tungsten film, it is necessary to previously form a tungsten nucleation control film on the Si film and, subsequently, take place a substitution reaction by conducting CVD at an appropriate temperature (200°–400° C.). According to this method, the thin tungsten film is less formed on the surface of the Si film and the reaction between $WF_6$ and Si proceeds forward in the direction of the depth of the Si film and even a thick Si film can be substituted for the tungsten film. Although an Si oxide film is preferred as the reaction control film of this kind, a film comprising any other material may also be used so long as it is a thin film having an effect of hindering the formation of nuclei for substituting the surface of the Si film for tungsten in the initial stage of the reaction and promoting the reaction into the direction of the depth of the film. In this case, it is preferable that the thickness of the film is as thin as 1–3 nm. Then, in view of the easiness of the pretreatment and its effect, an Si oxide film is preferably formed from a practical point of view. It is practical to use a method of apply oxidation by using a well-known chemical referred to as a chemical oxide for the chemicals capable of forming the thin silicon oxide film on the surface of the Si film. After the completion of the W-substituting reaction, the reaction control film is no more necessary and it is removed.

Further, if it is desired to terminate the tungsten substitution reaction at the boundary between the Si film and its underlying substrate, a film as a barrier for the reaction may be disposed at the interface. The barrier film contributes to the termination of the substitution reaction at the interface when the Si film is gradually substituted for tungsten in the direction of the depth from the surface. Accordingly, it is desirable that the barrier layer has low resistivity, as well as it is less reactive with tungsten and thermally stable substance in the temperature region for Si and WCVD ($\leq 400°$ C.). As the barrier layer, there can be used, a conductor layer comprising, for example, at least one of materials selected from the group consisting of transition metal elements such as W, Mo, Ti and Ta, nitrides or silicides thereof, cobalt silicides, aluminum nitrides and Ti-W alloys. The thickness is preferably from 50 to 300 nm, more preferably, 100 to 200 nm. Al, Au, Ag or the like is highly reactive and, hence, not preferred. The barrier film of this kind is effective, for example, in a case where direct connection between a semiconductor substrate and tungsten is not desirable or in a case where it is intended to surely terminate the tungsten substitution reaction at the bottom interface of the Si film which is an object of substitution with tungsten.

After substituting the Si film with the tungsten film, when $SiH_4$, $H_2$ or the like is added for reducing $WF_6$ as in the prior art, it is apparent that the tungsten deposition reaction from $WF_6$ is proceeded and tungsten can be deposited further in the gap of the substituted tungsten film or thereabove.

BRIEF DESCRIPTION OF THE DRAWINGS

FIGS. 15a to 15f are step charts illustrating a further embodiment of the present invention.

DETAILED DESCRIPTION OF THE PREFERRED EMBODIMENTS

Example 1

Figure 3:
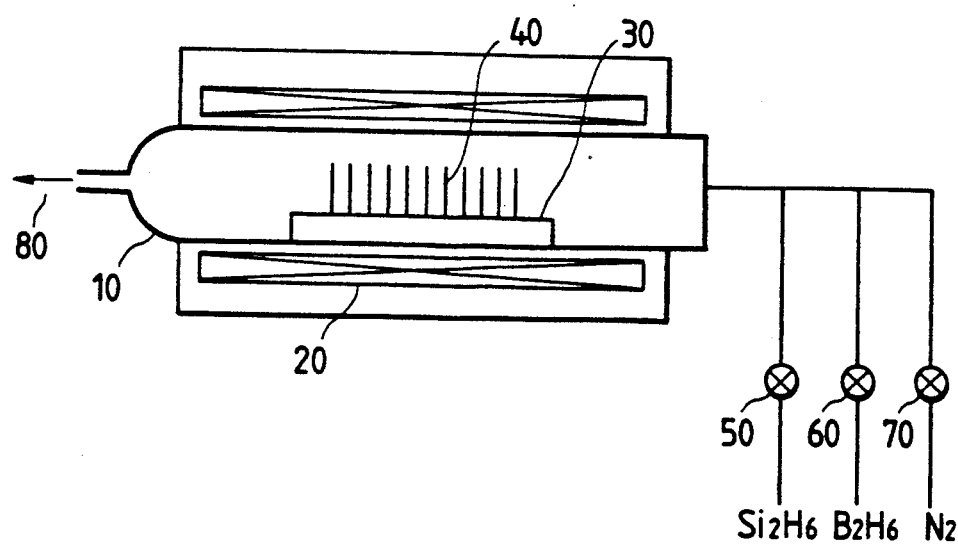
FIG. 3 is a view illustrating the outline of one embodiment of an apparatus used for practicing the present invention.
Figure 4A:
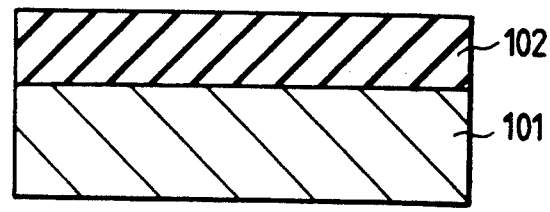
FIGS. 4a to 4c and FIGS. 5a to 5e are, respectively, views illustrating methods of preparing specimens in different embodiments according to the present invention.
Figure 4B:
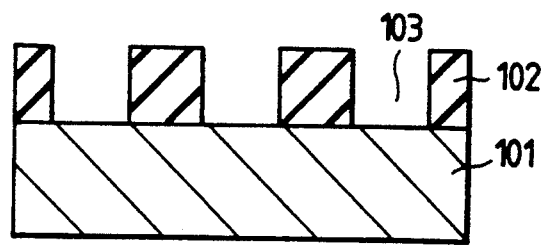
Figure 4C:
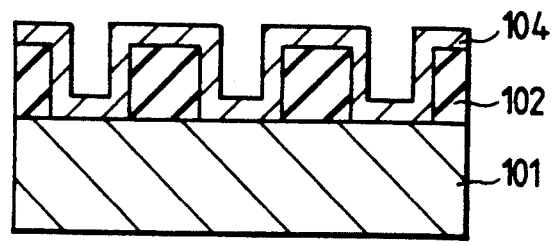

FIG. 3 is a schematic view for a horizontal type low pressure CVD apparatus used in this embodiment. A quartz holder 30 was placed at the center of a quartz tube 10, on which a silicon substrate 40 was placed. As the silicon substrate, the following two kinds of substrates were provided. A substrate 1 comprised an Si substrate formed with a thermal oxide of 100 nm thickness, on which a boron doped Si film was deposited and then measured for the film thickness. A substrate 2 was formed by the procedures shown in FIG. 4. At first, a thermal oxide film 102 of 1 $\mu$m thickness was formed on an Si substrate 101 (FIG. 4a). Then, grooves 103 each of 0.5 $\mu$m width were formed at an equivalent distance by known lithography and dry etching technique (FIG. 4b). Subsequently, an oxide film 104 of 100 nm thickness was formed by a low pressure CVD process (FIG. 4c).

After placing the substrate 1 and the substrate 2 on the quartz holder 30 and evacuating the inside of the quartz tube 10, a valve 50 and a valve 60 were opened to flow $Si_2H_6$ at 50 cc/min and $B_2H_6$ at 0.5 cc/min of flowrate simultaneously to deposit boron doped Si to a thickness of about 200 nm. The flowrate ratio for both of the gases: $B_2H_6/Si_2H_6$ was 0.01. The flowrate ratio can be properly selected within a range from 0.005 to 0.02. The pressure at the inside of the quartz tube was maintained at 30 Pa during supply of $Si_2H_6$ and $B_2H_6$. After flowing the gases for a predetermined period of time to deposit an Si film, the substrate 40 was taken out from the inside of the quartz tube 10.

Subsequently, the thickness of the Si film was measured for the substrate 1, by an optical interference method. On the other hand, the substrate 2 was cleaved along a plane in perpendicular to the groove 103 to estimate the step coverage factor. For the step coverage factor, the film thickness a for the upper portion of the step and the film thickness b at the lowermost portion in the side wall of the step were measured in a cross sectional photograph obtained by using a scanning electron microscope and it was defined as b/a.

Figure 1:
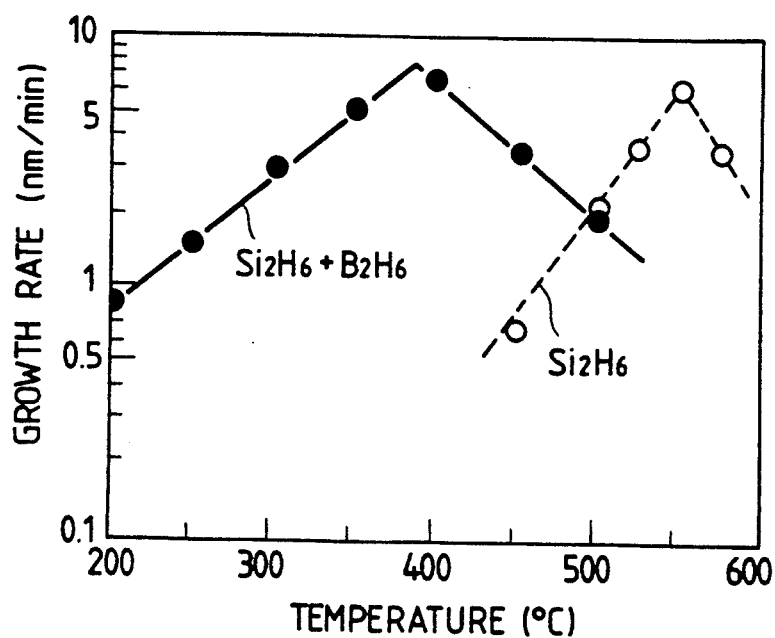
FIG. 1 is a graph illustrating a relation between an Si deposition rate and a temperature.

FIG. 1 shows a relation between a deposition rate and a deposition temperature for the Si film. For the comparison, the results obtained in a case of introducing only $Si_2H_6$ at a pressure of 30 Pa with no addition of $B_2H_6$ were also shown as the prior art in FIG. 1. From FIG. 1, it can be seen that the deposition temperature for the Si film can be lowered by so much as about 150° C. by the addition of $B_2H_6$ and the Si film can be deposited at a sufficient rate even lower than 400° C. In the case of adding $B_2H_6$, the deposition rate increases along with the increase of the deposition temperature lower than 400° C., in which the system constitutes a surface reaction control. On the other hand, the deposition rate decrease at a temperature higher than 400° C. and the system constitutes a mass transfer control. In order to process a plurality of substrates together at a good uniformity, it is desirable that the system constitutes the surface reaction control and it is necessary that the deposition temperature of the film is lower than 400° C.

Figure 2:
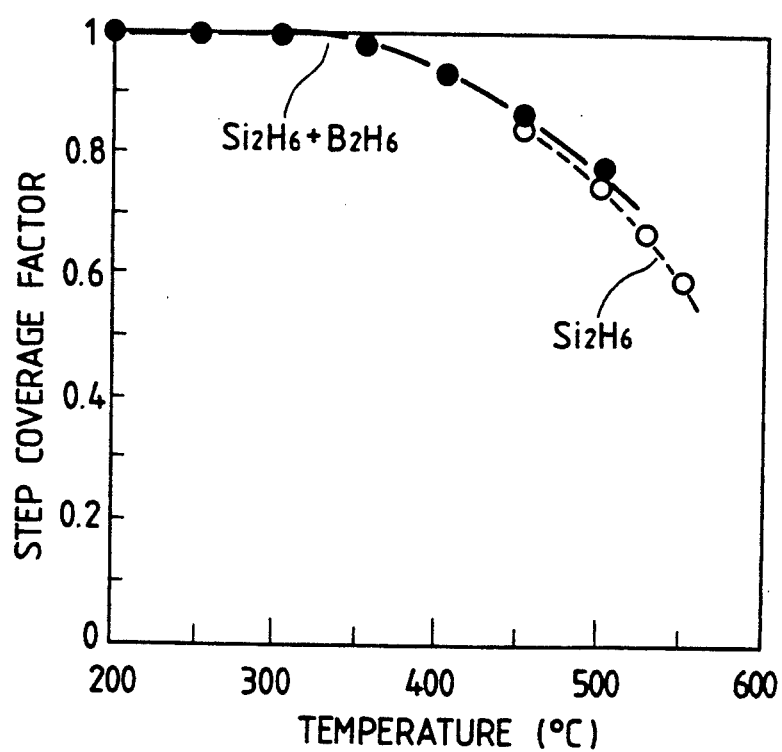
FIG. 2 is a graph illustrating a relation between a step coverage of the Si film and a deposition temperature.

FIG. 2 shows a relation between the deposition temperature and a step coverage factor of the Si film. In a case where the deposition temperature for the Si film was lower than 400° C., the step coverage factor was approximately 1 in which the inside of the deep groove could be buried. It was observed, on the other hand, in a case where the film deposition temperature was higher than 400° C. and in a case where $B_2H_6$ was not added, that the step coverage is deteriorated to less than 0.9 and the inside of the deep groove could not be buried completely.

If phosphine ($PH_3$) or arsine ($AsH_3$) as an n-type doping gas was added instead of $B_2H_6$ to $Si_2H_6$, there was no change in the reaction of $Si_2H_6$ and no increase was observed in the deposition rate. Further, the step coverage factor was substantially identical with that of a case not containing the impurity and it was impossible to completely bury the inside of the deep groove.

According to this embodiment, the inside of the deep hole can be buried with Si at a sufficient deposition rate and step coverage by depositing the boron doped amorphous Si film at a temperature lower than 400° C. by using $Si_2H_6$ and $B_2H_6$.

Example 2

Figure 5A:
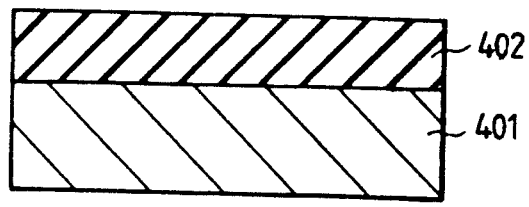
Figure 5B:
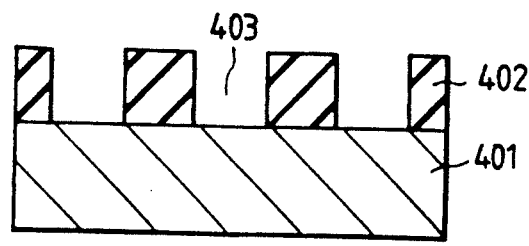
Figure 5C:
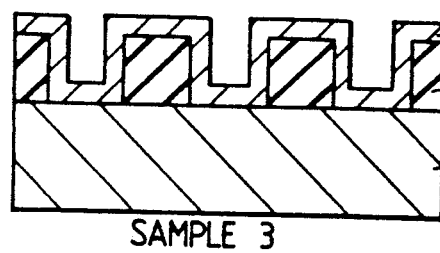
Figure 5D:
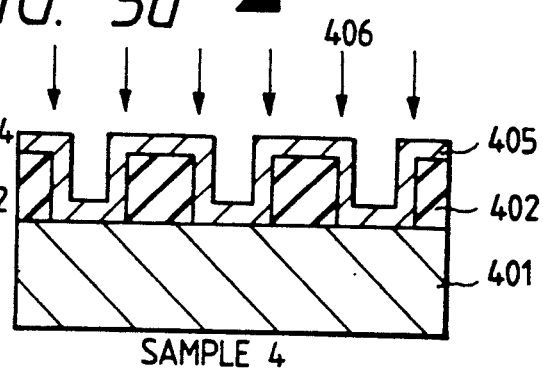
Figure 5E:
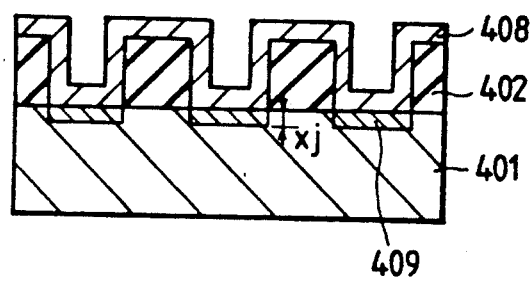
Figure 6A:
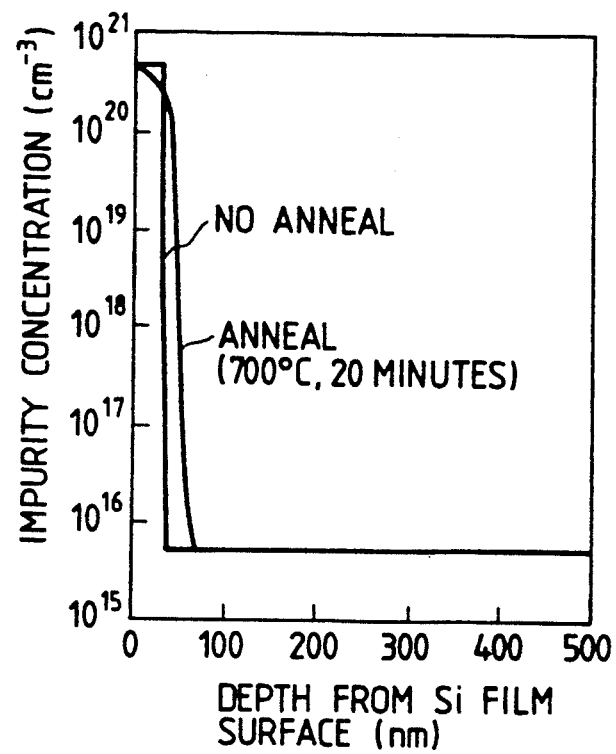
FIGS. 6a, 6b and FIGS. 7a, 7b are, respectively, views for illustrating one embodiment according to the present invention.
Figure 6B:
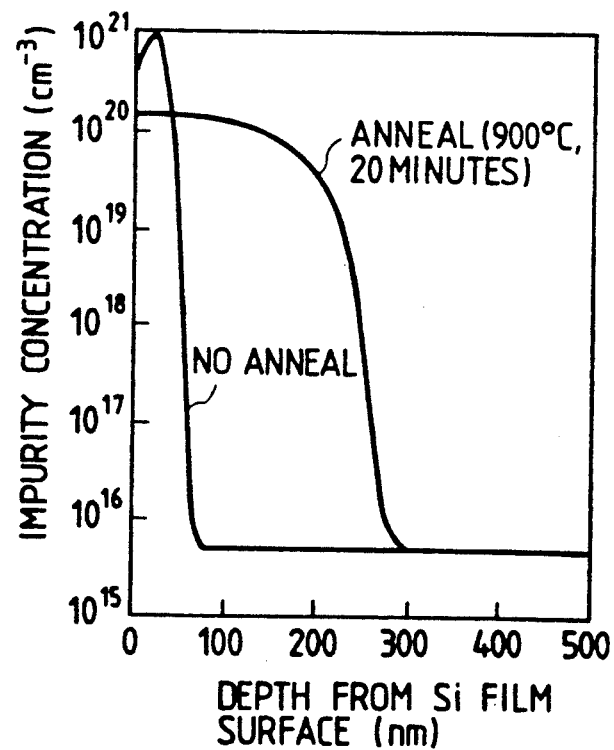

This embodiment illustrates a case of using a boron doped amorphous Si film formed in accordance with the present invention as a diffusion source of impurities. Two kinds of specimens 3, 4 were prepared by the method shown in FIG. 5. At first, an $Si_3N_4$ film 402 of 0.5 $\mu$m thickness was deposited on an Si substrate 401 by a well-known CVD (FIG. 5a). Then, a portion of the $Si_3N_4$ film 402 was removed by well-known lithography and dry etching technique to form grooves 403 each of 0.5 $\mu$m with at an equal distance (FIG. 5b). Subsequently, an Si film was formed and the impurity was doped as shown below. For the specimen 3, $Si_2H_6$ and $B_2H_6$ were supplied at 50 cc/min and 0.5 cc/min simultaneously and, under the conditions at 350° C. and 30 Pa, a boron doped amorphous Si film 404 of 30 nm thickness was formed as shown in FIG. 5c. In the specimen 4, after forming a polycrystalline Si film 405 of 30 nm thickness under the conditions at 630° C. and 80 Pa by using SiH$_4$ as a source gas as shown in FIG. 5d, BF$_2$ ions 406 were implanted at an implantation energy of 20 KeV and an implantation dose of $2.5 \times 10^{15}$/cm$^3$. Then, the specimens 3 and 4 were annealed at such a temperature that impurities are thoroughly activated to form a diffusion layer 409, and then the distance that the impurities diffused from the surface to the inside of the Si substrate 401 (that is depth x of the diffusion region 409) was measured by secondary ion mass spectroscopy (SIMS). The results are shown in FIGS. 6a, 6b. In the specimen 3 using the boron doped amorphous Si film as the diffusion source in accordance with the present invention, activation for the impurities was completed at a low temperature of 700° C., and an extremely shallow junction of 35 nm diffusion depth was formed as shown in FIG. 6a. On the other hand, in a case of using the specimen 4 in which BF$_2$+ ions were implanted into the polycrystalline Si film, a heat treatment at about 900° C. was necessary for sufficiently activating the impurity and, as a result, a diffusion depth was increased as large as 2SO nm and a formation of a shallow junction was impossible.

According to this embodiment, it was confirmed that the temperature of the heat treatment could be lowered and an extremely shallow junction could be formed while suppressing the diffusion of the impurities by using the boron doped amorphous Si film formed In accordance with the present invention as the impurity diffusion source.

Transition from the amorphous Si to the polycrystalline Si occurs about at a temperature higher than 550° C. However, since the reaction is extremely slow and it takes a long time at a temperature from 550° to 600° C., it is practically preferred to apply annealing about at a temperature higher than 6SO° C. In this case, diffusion of boron atoms in the amorphous Si film is conducted simultaneously but it is preferred to further apply annealing in order to obtain a predetermined junction depth.

Example 3

This embodiment shows a case of using a boron doped amorphous Si film formed in accordance with the present invention as a diffusion source upon forming a source-drain region of a MOS transistor.

Figure 7A:
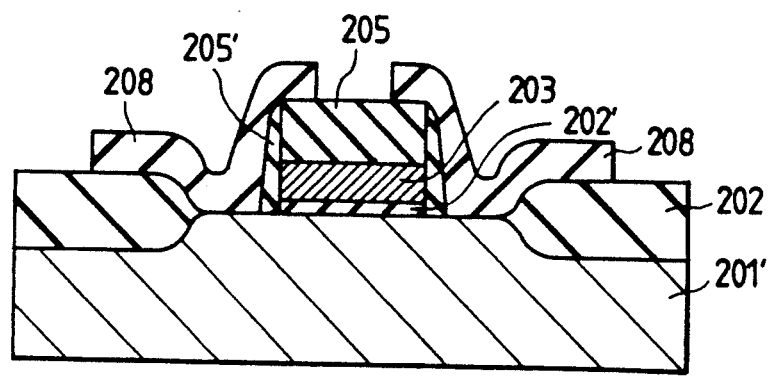

The MOS transistor was prepared by the procedures shown below. At first, as shown in FIG. 7a, an isolation oxide film 202 was formed by a well-known selective oxidation technique on the surface of an n-type Si substrate 201' with 10 Ωcm of resistivity and (100) of crystal orientation. Then, the surface of the Si substrate 201' was oxidized in an oxygen atmosphere to form a gate oxide film 202' of 10 nm thickness. Then, after depositing a polycrystalline Si film 203 of 100 nm by a low pressure CVD process and, adding impurities to lower the resistivity, an SiO$_2$ film 205 of 200 nm thickness was formed by a low pressure CVD process. Subsequently, unnecessary portions in the SiO$_2$ film 205 and the polycrystalline Si film 203 were removed by known lithography and dry etching technique. Subsequently, after forming an SiO$_2$ film of 20 nm thickness entirely by a low pressure CVD process, anisotropic dry etching was applied till the surface of the Si substrate 201' was exposed to form the SiO$_2$ film 205' only on the side wall such as of SiO$_2$ film 205. Subsequently, a boron doped amorphous Si film 208 of 200 nm thickness was formed under the conditions at 350° and 30 Pa by a low pressure CVD process using Si$_2$H$_6$ and B$_2$H$_6$ as source gases and, successively the Si film 208 was patterned into a predetermined shape by a known method (FIG. 7a).

Figure 7B:
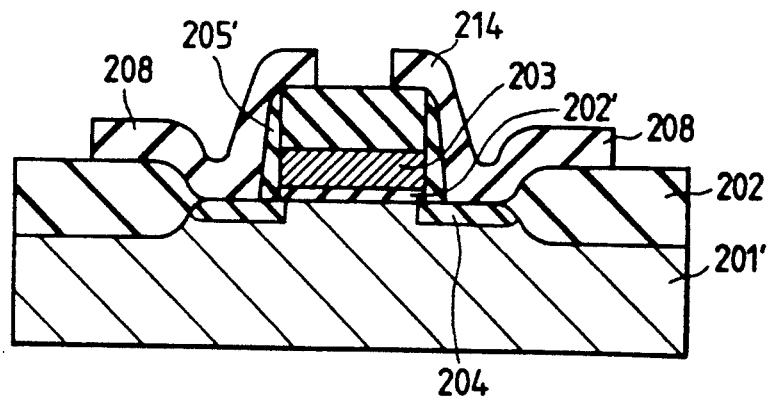
Figure 8A:
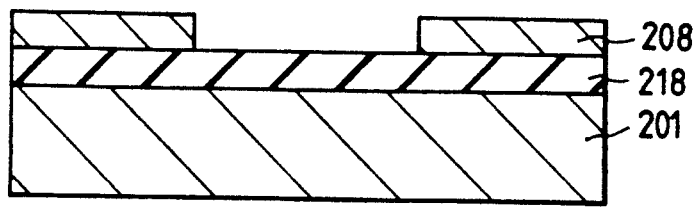
FIGS. 8a to 8d are step charts for illustrating another embodiment of the present invention.
Figure 8B:
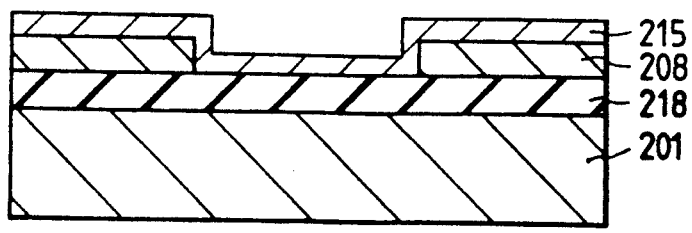
Figure 8C:
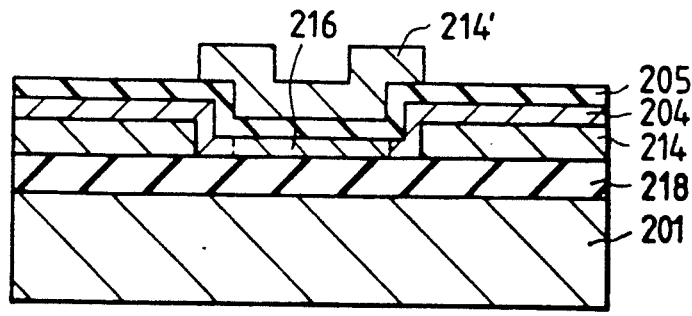
Figure 8D:
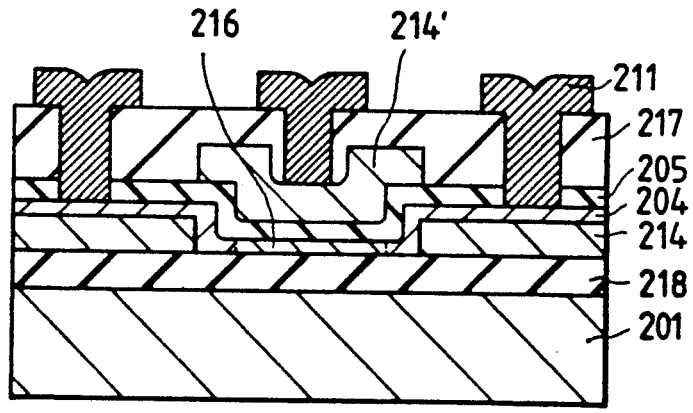

Then, the amorphous Si film 208 was annealed in a nitrogen atmosphere at 700° C. for 20 min to diffuse boron in the amorphous Si film 208 into the Si substrate to form a source-drain region 204 as shown in FIG. 7b. By the annealing, the Si film 208 is transformed from amorphous to polycrystalline 214.

The MOS transistor prepared in this embodiment had a high punch through break down voltage and could be operated with a sufficient margin even in a case where the gate length was extremely short as about 0.3 μm, because a junction of extremely shallow and of generally rectangular shape could be formed by thermal diffusion at a temperature as low as 700° C. On the other hand, in a case of forming a source-drain region by BF$_2$+ ion implantation using a polycrystalline Si film gate electrode as a mask as in the prior art, the effective channel length was shortened and a punch through phenomenon was caused at a voltage lower than the method according to the present invention. As a result, in a case of the gate length of 0.3 μm, it was impossible to obtain stable transistor characteristics, because the implanted impurities were distributed over a wide range in accordance with a Gaussian distribution and because a heat treatment higher than 900° C. was necessary for the activation of impurities, so that implanted impurities were diffused deeply in the silicon substrate.

In this embodiment, since impurities are diffused from the boron doped Si film formed in accordance with the present invention to form a source-drain region, there is provided an advantageous effect capable of preparing a MOS transistor of high punchthrough breakdown voltage and capable of down scaling the LSI.

Example 4

This embodiment shows a case of using the boron doped Si film deposited in an amorphous state was used for the formation of a diffusion layer in a polycrystalline Si MOS transistor.

A polycrystalline Si MOS transistor was prepared by the procedures shown in FIG. 8. At first, a dielectric SiO$_2$ film 218 was formed on a semiconductor substrate 201 as shown in FIG. 8a. Subsequently, Si$_2$H$_6$ and B$_2$H$_6$ were supplied simultaneously by a low pressure CVD process to form a boron doped amorphous Si film 208 of 100 nm thickness under the conditions at 350° C. and 30 Pa. Then, the boron doped Si film 208 was patterned into a predetermined shape by using well-known lithography and dry etching. Subsequently, an amorphous Si film 215 of 10 nm thickness not containing impurities was formed by a low pressure CVD process using Si$_2$H$_6$ as a source gas at 525° C., as shown in FIG. 8b. Then, a SiO$_2$ film 205 of 20 nm thickness was deposited at 700° C. by a low pressure CVD process. This process transformed the Si films 208, 215 into polycrystalline Si films 214, 216 and, simultaneously, a diffusion layer 204 was formed. Then, a boron doped amorphous Si film of 100 nm thickness was formed by a low pressure CVD process by using Si$_2$H$_6$ and B$_2$H$_6$ as source gases and, after annealing in a nitrogen atmosphere at 700° C. for 20 min, it was patterned to form a gate electrode 214' of a transistor as shown in FIG. 8c. Then, after forming an interlevel dielectric film 217 by a well-known CVD process as shown in FIG. 8d, a contact hole reaching the diffusion layer 204 was formed and, after forming an Al film 211 successively, it was patterned to form lead wirings.

The polycrystalline Si MOS transistor prepared in this embodiment had a high punchthrough break down voltage and could be operated with a sufficient margin even in a case where the gate length was about 0.3 μm. In the prior art, the source-drain was formed by ion implantation through the gate oxide film 205 which resulted in a problem of damaging the gate oxide film. In this embodiment, since the ion implantation is not employed, the gate oxide film is free from such damage.

With this embodiment, since the Si film formed at a low temperature by using $SiH_6$ and $B_2H_6$ as the source-drain of the polycrystalline Si MOS transistor, high reliability can be obtained even upon large scale integration.

Example 5

This embodiment shows an example of using a boron doped amorphous Si film formed in accordance with the present invention for forming an emitter region of a pnp type bipolar transistor.

Figure 9A:
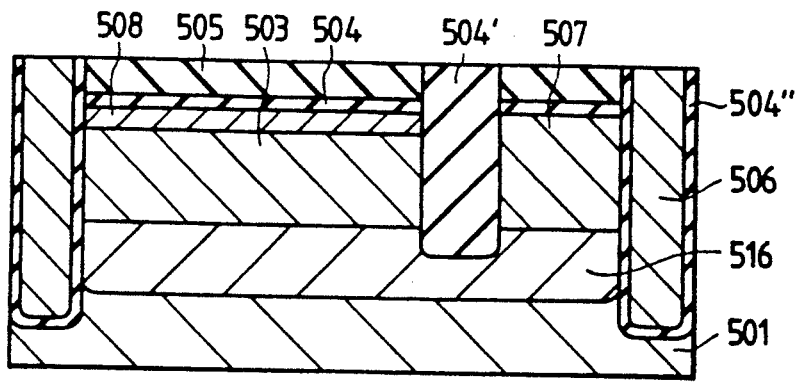
FIGS. 9a to 9f and FIGS. 10a–10f are, respectively, step charts for illustrating an embodiment in which the present invention is applied to the formation of an emitter or a base of a bipolar transistor.

At first, as shown in FIG. 9a, a boron buried layer 516 with 1.2 μm depth was formed at a predetermined region on an n-type Si substrate 501 with crystal orientation (100) by a thermal diffusion using boron nitride. Then, after forming an epitaxial layer 503 of 500 nm thickness, an $SiO_2$ film 504 of 30 nm thickness was formed by a well-known dry oxidation method and, further, an $Si_3N_4$ film 505 of 80 nm thickness was deposited by a low pressure CVD process. Then, after forming an isolation groove reaching the buried layer and a groove for the separation of emitter and collector regions by a well-known photoetching technique, the grooves were burred with $SiO_2$ films 504′, 504″, and polycrystalline Si 506. Then, an $Si_3N_4$ film was formed and, after implantation of boron ions thereto using a mask, an annealing was performed at 950° C. for 30 min to form a collector region 507. Then, ion implantation of phosphorus was conducted and then a heat treatment is applied in a nitrogen atmosphere at 900° C. for 10 min to form an extrinsic base area 508 connecting intrinsic base region.

Figure 9B:
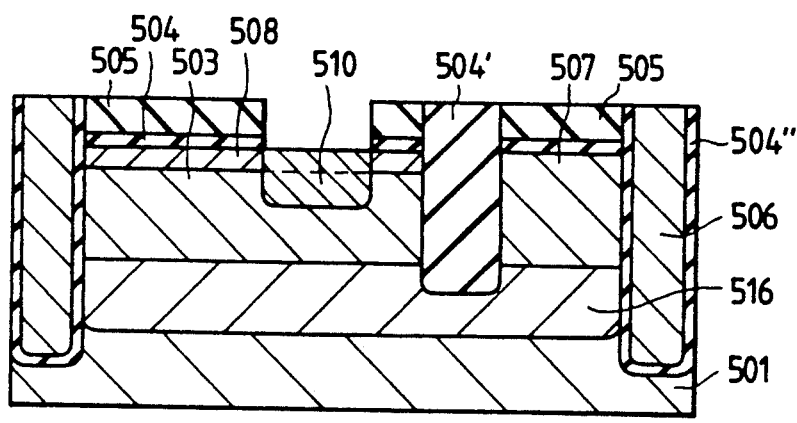

Subsequently, the $Si_3N_4$ film 505 and the $SiO_2$ film 504 at predetermined regions were successively removed by using well-known lithography and dry etching. Subsequently, $5 \times 10^{13}/cm^2$ of arsenic ions were implanted under an acceleration voltage of 40 KeV and then a heat treatment was applied in a nitrogen atmosphere at 900° C. for 10 min to form an intrinsic base region 510 as shown in FIG. 9b.

Figure 9C:
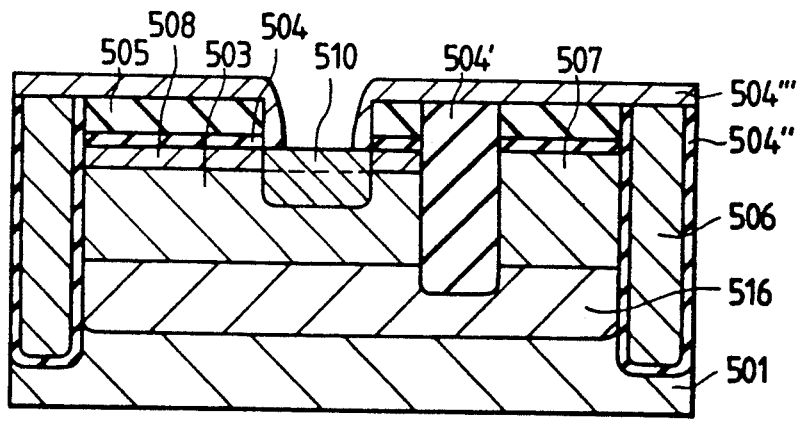

As shown in FIG. 9c, an $SiO_2$ film 504‴ was deposited by means of a well-known low pressure CVD process and holes for forming an emitter was opened by well-known photoetching.

Figure 9D:
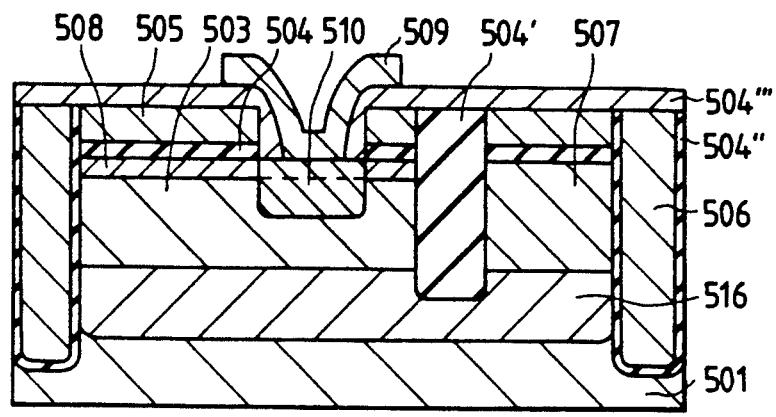

Then, a boron doped amorphous Si film 509 of 50 nm thickness was formed as shown in FIG. 9d by a low pressure CVD process using $Si_2H_6$ and $B_2H_6$ as source gases under the conditions at 350° C., 30 Pa. In this case, the boron concentration in the Si film was set to $5 \times 10^{20}/cm^3$. Then, unnecessary portion of the amorphous Si film 509 was removed by the well-known photoetching.

Figure 9E:
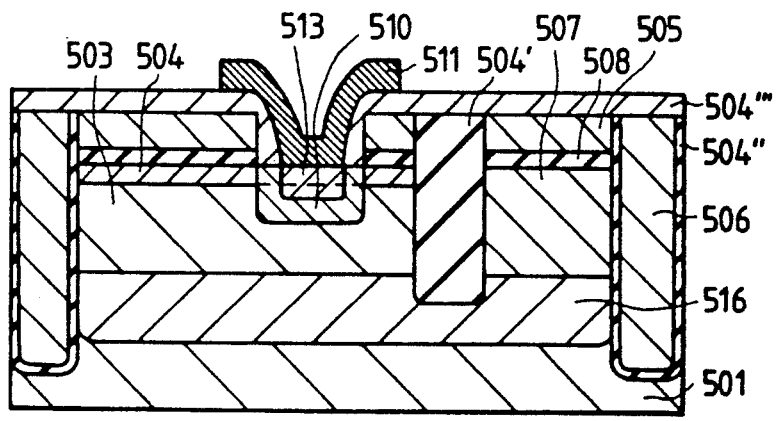

An annealing was then performed in a nitrogen atmosphere at 700° C. for 20 min., and boron in the amorphous Si film 509 was diffused into the Si substrate to form an emitter region 513 as shown in FIG. 9e. By the annealing, the amorphous Si film 509 is transformed into a polycrystalline silicon film 511 and shows conductivity.

Figure 9F:
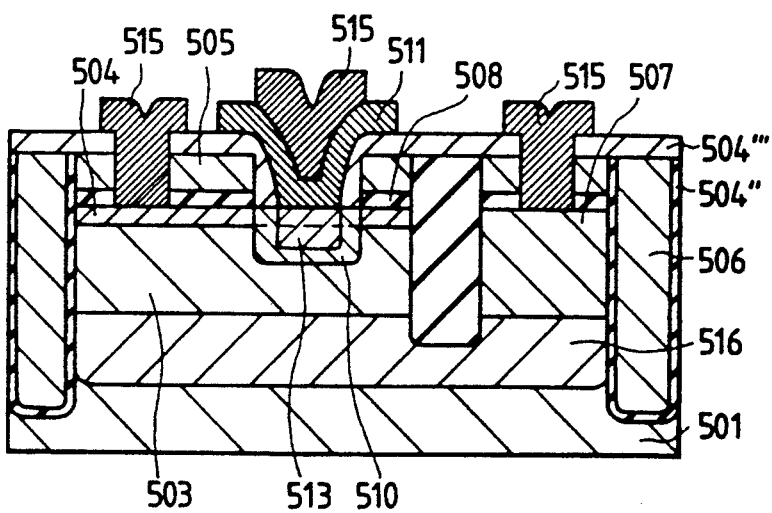

After forming contact holes to an external base region and a collector as shown in FIG. 9f, an Al film 515 was formed and patterned into a predetermined shape as electrodes.

Both of the thickness for the emitter and the base regions of the pnp bipolar transistor formed in this embodiment was about 20 nm which was extremely shallower as compared with emitter or base formed in the prior art and, as a result, high cut off frequency could be obtained. Further, the emitter resistance was also reduced as compared with the prior art.

In accordance with this embodiment, since a boron doped amorphous Si film was formed at a low temperature by using $Si_2H_6$ and $B_2H_6$ as source gases and impurities were diffused from the Si film to form an emitter region, the cut off frequency of the bipolar transistor could be improved to increase the operation speed.

Example 6

This embodiment shows an example of using a boron doped amorphous Si film for the formation of a base region of an npn type bipolar transistor.

Figure 10A:
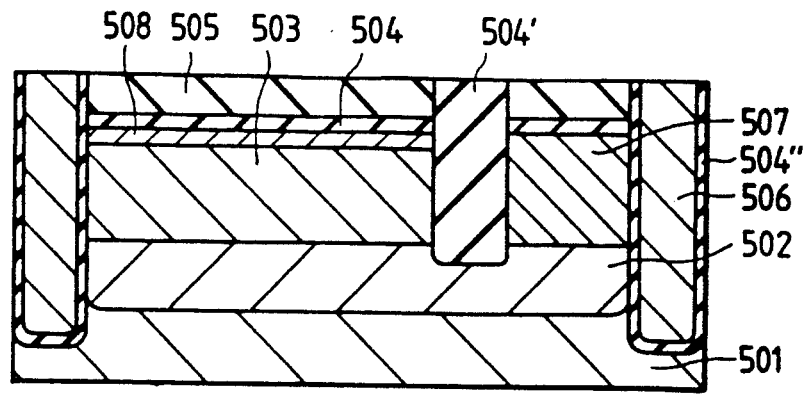

At first, as shown in FIG. 10a, an antimony buried layer 502 of low resistivity with 1.2 μm thickness was formed by thermal diffusion in a predetermined region on a p-type Si substrate 501 of crystal orientation of (100) and resistivity of 10 ohm cm. Then, after forming an epitaxial layer 503 of 400 nm thickness by using a well-known Si epitaxial growth technique, there were formed an $SiO_2$ film 504 of 30 nm thickness by a dry oxidation method and an $Si_3N_4$ film 505 of 80 nm thickness by a low pressure CVD process successively. Subsequently, a groove for device isolation reaching the buried layer 502 and a groove for separating the emitter and the collector were formed by a well-known photoetching, and the inside of the grooves were buried by forming $SiO_2$ films 504′, 504″ and polycrystalline Si 506 by the well-known low pressure CVD processes. After forming an $Si_3N_4$ film (not illustrated) and implanting phosphorous ion by using the film as a mask, an annealing was performed at 950° C. for 30 min to form a collector region 507. Subsequently, $BF_2+$ ions were implanted and, succeedingly, an annealing was applied in a nitrogen atmosphere at 900° C. for 10 min to form an extrinsic base region 508 connecting intrinsic base region.

Figure 10B:
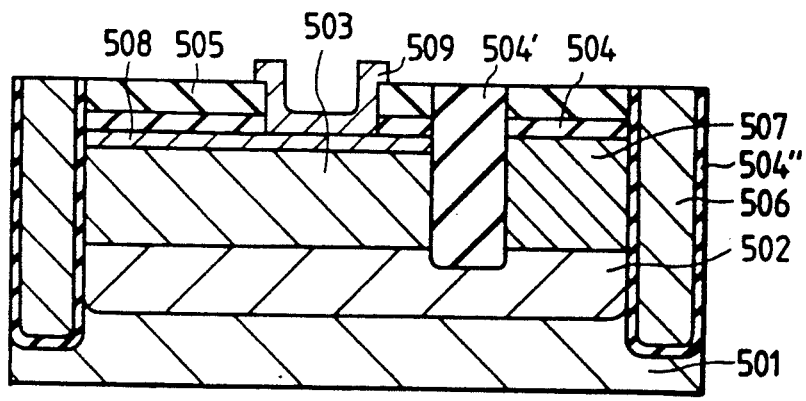

As shown in FIG. 10b, the $Si_3N_4$ film 505 and the $SiO_2$ film 504 at predetermined regions were successively removed by using well-known lithography and dry etching. Then, a boron doped Si film 509 of 20 nm thickness was formed by a low pressure CVD process using $Si_2H_6$ and $B_2H_6$ as source gases under the conditions at 300° C., 20 Pa. The boron concentration in the film was controlled so as to be $1 \times 10^{19}/cm^3$. The boron doped Si film 509 was then patterned into a predetermined shape by a well-known photoetching.

Figure 10C:
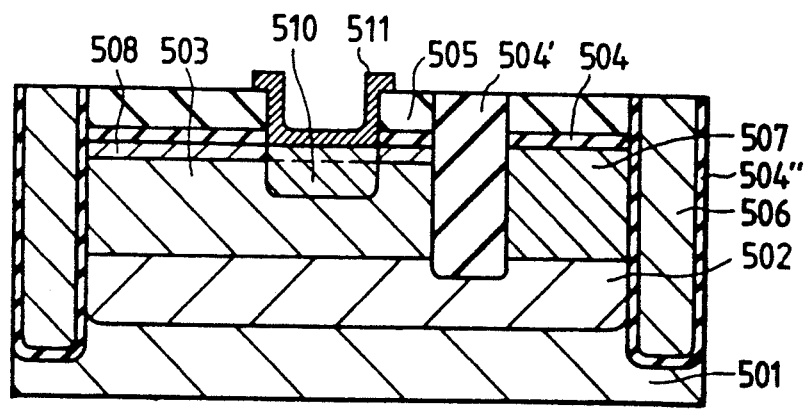
Figure 10D:
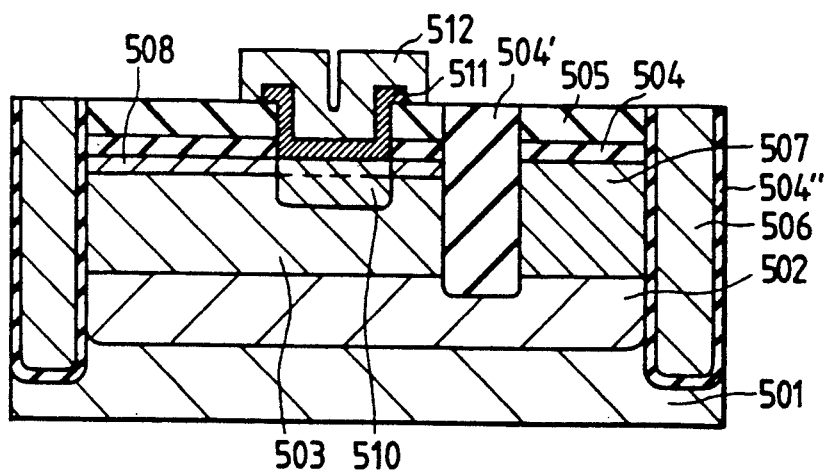

A heat treatment was applied in a nitrogen atmosphere at 700° C. for 20 min and boron in the Si film 509 was diffused into an Si substrate to form the base region 510 as shown in FIG. 10c. With this heat treatment, the Si film 509 was transformed into single crystal by the solid phase epitaxial growth at the portion in contact with the substrate and into a polycrystalline silicon film 511 at the remaining portion.

As shown in FIG. 10, a phosphorous doped amorphous Si film 512 of 50 nm thickness was formed on an Si film 511 by a low pressure CVD process using $Si_2H_6$ and $PH_3$ as source gases under the conditions at 500° C., 30 Pa. In this case, the phosphorous concentration in the Si film 512 was controlled to $4\times 10^{20}/cm^3$. Then, the amorphous Si film 512 was patterned into a predetermined shape by a well-known photoetching as shown in FIG. 10d.

Figure 10E:
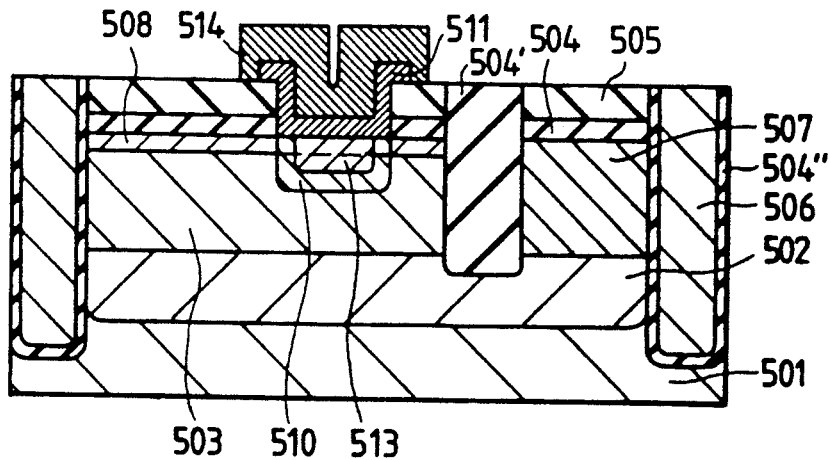

Subsequently, an annealing was performed in a nitrogen atmosphere at 700° C. for 20 min and phosphorous in the Si film 512 was diffused into the Si substrate to form an emitter 513 as shown in FIG. 10e. With the annealing, the Si film 512 was transformed into a polycrystalline silicon film 514 and showed electroconductivity.

Figure 10F:
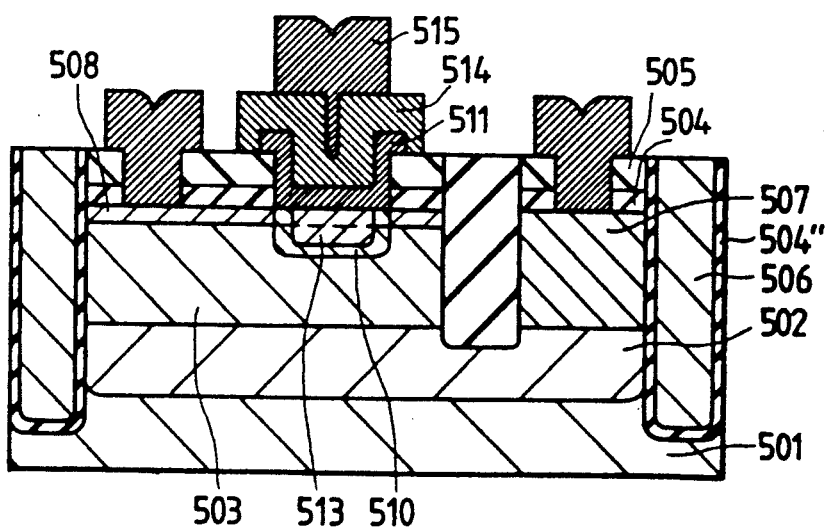

Successively, after forming contact holes each to the extrinsic base region and the collector region, an Al film 515 was formed as an electrode as shown in FIG. 10f.

Since the thickness of the base region of the bipolar transistor formed in this embodiment is extremely shallow as about 30 nm compared with that of the prior art, much higher cut off frequency could be obtained as compared with the prior art.

With this embodiment, since a boron doped Si film was formed by using $Si_2H_6$ and $B_2H_6$ as source gases and impurities were diffused therefrom to form a base region, there is an effect capable of improving the cutting frequency of the bipolar transistor.

Example 7

This embodiment shows an example of using a boron doped amorphous Si film formed at a low temperature in accordance with the present invention as a memory cell in a dynamic random access memory (DRAM).

Figure 11A:
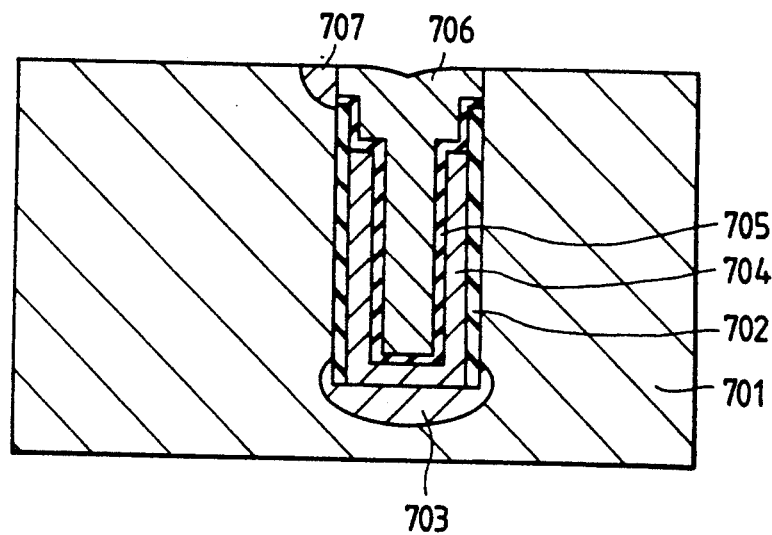
FIGS. 11a and 11b are views illustrating an embodiment in which the present invention is applied to the formation of a memory device.

As shown in FIG. 11a, a groove of 5 μm depth was formed in a predetermined region of an Si substrate 701 by a well-known lithography and dry etching. Then, after forming an $SiO_2$ film 702 by a low pressure CVD process using $SiH_4$ and $N_2O$ as source gases, anisotropic etching was applied to leave the $SiO_2$ film 702 only on the side wall in the groove. A boron doped amorphous Si film 704 was formed by a low pressure CVD process using $Si_2H_6$ and $B_2H_6$, which was patterned by a well-known photoetching. The forming temperature was set to 350° C. and the pressure was set to 30 Pa. Subsequently, a heat treatment was applied in a nitrogen atmosphere at 900° C. to form a boron diffusion layer 703 as a plate electrode. In this case, the boron doped amorphous Si film 704 was transformed into polycrystalline Si. Then, a silicon nitride film ($Si_3N_4$) was deposited by a low pressure CVD process using $SiH_2Cl_2$ and $NH_3$, and the surface of the film was oxidized to form a silicon nitride film/oxide film composite film 705. Then, a boron doped amorphous Si 706 was deposited by a low pressure CVD process using $Si_2H_6$ and $B_2H_6$ to completely bury the inside of the groove. The deposition conditions were at 350° C. for reactor temperature and 30 Pa of pressure. Under the conditions, the amorphous Si was excellent in the step coverage and the inside of the groove could be buried substantially completely even if the aspect ratio was more than 1.5. Subsequently, well-known dry etching was applied to the entire surface to leave the amorphous Si film only in the groove and, thereafter, a heat treatment was applied in a nitrogen atmosphere at 700° C. for 20 min to transform the amorphous Si into a polycrystalline structure, which was used as a storage node. In this case, boron in the Si film 706 was diffused into the substrate 701 to form a diffusion layer 707. A capacitor portion was formed by the steps described above.

Figure 11B:
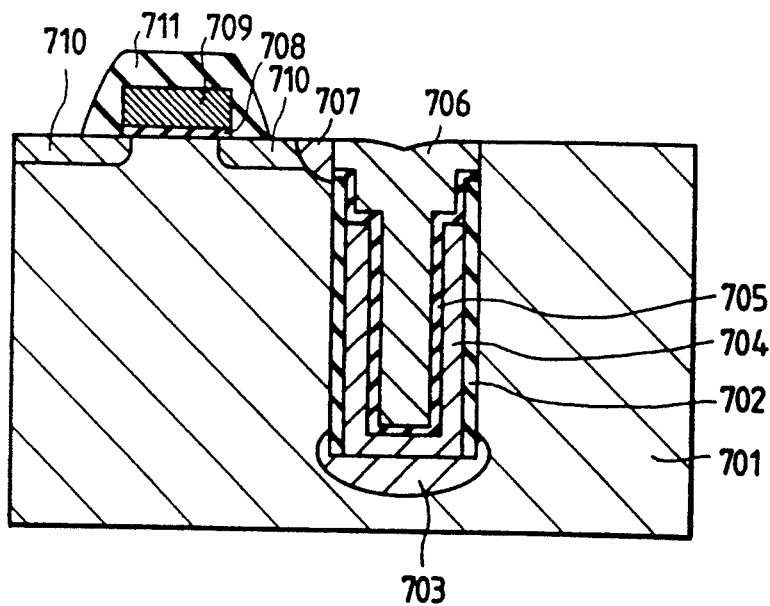

Then, as shown in FIG. 11b, the surface of the Si substrate 701 was oxidized in an oxygen atmosphere to form a gate oxide 708 of 6 nm thickness. A boron doped amorphous Si film of 150 nm thickness was formed by a low pressure CVD process using $Si_2H_6$ and $B_2H_6$ and treated in a nitrogen atmosphere at 650° C. for 20 min to transform the amorphous Si into a polycrystalline structure, which was patterned by well-known lithography and dry etching to form a gate electrode 709. After ion implanting $BF_2+$ ions, a heat treatment was applied in a nitrogen atmosphere at 900° C., to form source-drain regions 710. Subsequently, CVD $SiO_2$ film 711 was deposited and fabricated to complete a transistor.

The resistivity of the storage node and the plate electrode of the memory cell prepared in this embodiment was extremely low as compared with that in the prior art and, accordingly, operation at much higher speed than usual was possible. Further, since the boron doped Si film showed excellent step coverage, occurrence of voids in the groove could be prevented and open failure or the like could be reduced remarkably as compared with the prior art. With this embodiment, since the boron doped amorphous Si film formed at a low temperature was used for the storage node or the plate electrode, higher speed operation and reliability improvement of DRAM could be attained.

Further although explanations have been made in this embodiment to a DRAM having a tranch-type capacitor, the same effect was also obtained for a stacked capacitor.

Example 8

This embodiment shows an example of substituting the boron doped amorphous Si film for a tungsten film and filling the inside of the opening with tungsten.

The fundamental constitution of the device used in this embodiment is identical with a device shown in FIG. 3 and only the gases to be introduced are different.

The followings were used for the specimen substrate 40. At first, an $SiO_2$ film with 100 nm thick was formed on an Si wafer by thermal oxidation. Then, a boron doped amorphous Si film with 1 μm thick was formed by using $Si_2H_6$ and $B_2H_6$ as source gases. In this case, the flow rates for $Si_2H_6$ and $B_2H_6$ were set to 50 cc/min and 0.5 cc/min respectively and the reactor temperature was set to 350° C. and the pressure was set to 30 Pa.

A quartz holder 30 was placed at the center of the quartz tube, on which a specimen substrate 40 was mounted. After evacuating the inside of the quartz tube 10, a valve 50 and a valve 70 were opened to introduce $WF_6$ and $N_2$ into a reactor, and the boron doped amorphous Si film was substituted for a tungsten film. The flow rates for $WF_6$ and $N_2$ were, respectively, 20 cc/min and 2000 cc/min, the reactor temperature was 300° C. and the reactor pressure was set to 100 Pa. After introducing gases for predetermined of time to substitute films, the specimen substrate 40 was taken out. Subsequently, the specimen substrate 40 was cleaved along the plane in vertical thereto, and the film thickness of the tungsten formed was measured by scanning electron microscope. The results are shown in FIG. 12.

Figure 12:
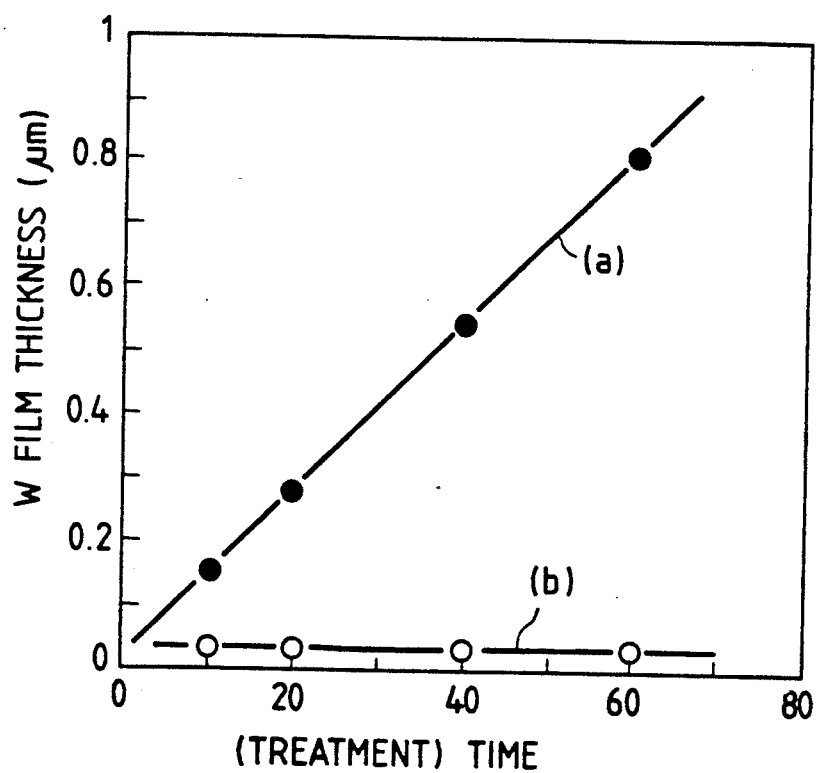
FIG. 12 is a view illustrating a relation between a thickness and a time of a tungsten film obtained upon substituting an Si film with tungsten.

In FIG. 12, a linear line (a) shows a result of forming a chemical oxide film of 1.1 nm thickness as a tungsten nucleation reaction control film on the surface of a boron doped amorphous Si film by dipping a nitric acid solution heated to 110° C. and, thereafter, substituting the amorphous Si film for a tungsten film. The thickness of the tungsten film was increased in proportion as the time for substitution.

In FIG. 12, a linear line (b) shows a result of dipping a boron doped amorphous Si film with a 1% HF aqueous solution for 60 sec and removing the oxide at the surface of the Si film, and then substituting the amorphous Si film for the tungsten film. At 300° C., the thickness of the tungsten film formed was about 10 nm which was constant independent on the time of formation and the substitution reaction scarcely proceeded.

With this embodiment, since the tungsten reaction control film was formed on the boron doped amorphous Si film and it was reacted with WF$_6$, it was recognized that a tungsten film approximately of 1 μm thickness could be formed. In addition, since the amorphous Si film formed under the conditions described above was extremely excellent in the step coverage, it was confirmed that the inside of the contact hole or the via hole could be filled extremely satisfactorily with tungsten by substituting the amorphous Si for tungsten.

Example 9

FIG. 13a to 13i are views for applying steps of forming a tungsten film buried layer.

Figure 13A:
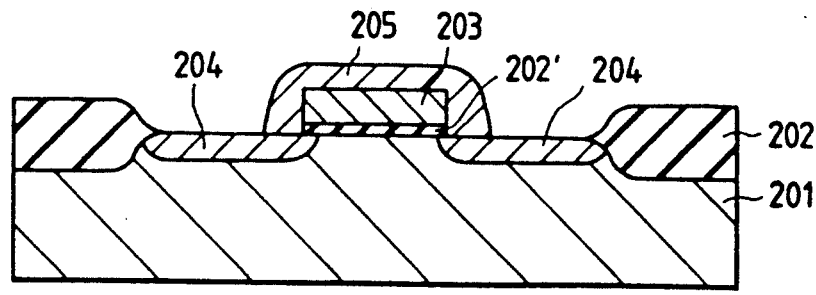
FIGS. 13a to 13i are step charts illustrating another embodiment of the present invention.

At first, as shown in FIG. 13a, after forming an isolation SiO$_2$ film 202 and a gate oxide 202' on a p-type (100) Si substrate 201 by a well-known technique, a polycrystalline Si film 203 with 300 nm thick was deposited by a low pressure CVD process. After doping impurities to reduce the resistivity of the polycrystalline Si film, patterning was applied by usual lithography and dry etching technique to form a gate electrode. Arsenic ion implantation was applied by using the gate electrode 203 comprising the thus formed Si film as a mask and, further, an annealing was performed to form an impurity diffusion layer 204 as source-drain and, subsequently, an SiO$_2$ film 205 was deposited as an interlevel oxide film by a low pressure CVD process.

Figure 13B:
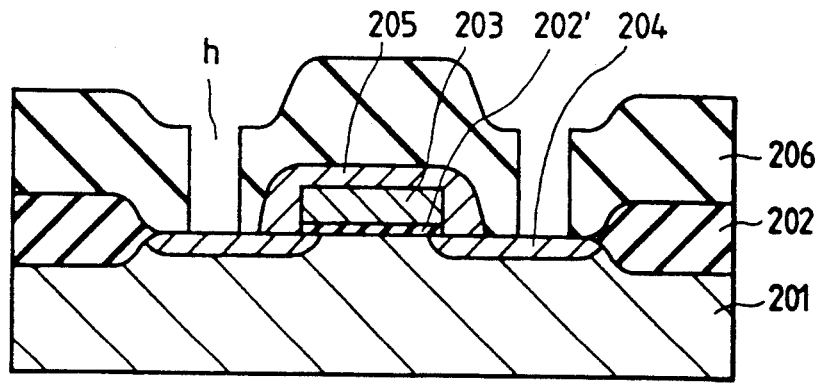

As shown in FIG. 13b, an SiO$_2$ film containing boron and phosphorous (boron doped phosphosilicate glass film, wherein after simply referred to as BPSG film) 206 was formed to a thickness of 700 nm by a CVD process and, subsequently, it was subjected to reflow by annealing in N$_2$ at 900° C. and then contact holes h each of 0.5 μm diameter was formed by lithography and dry etching technique.

Figure 13C:
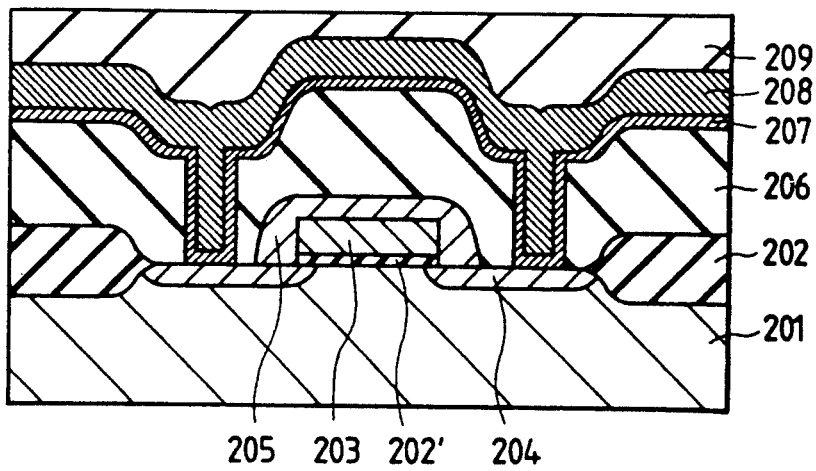

Then, as shown in FIG. 13c, after forming titanium nitride (TiN) film 207 (150 nm thickness) by reactive sputtering over the entire surface, boron doped amorphous Si film 208 with 500 nm thick was formed by a low pressure CVD process by using Si$_2$H$_6$ and B$_2$H$_6$ as the source gases at a reactor temperature of 350° C. and under a pressure of 30 Pa. In this case, if the film deposition temperature was higher than 400° C., peeling of the TiN film occurred. Accordingly, it is desirable that the deposition temperature for the Si film was lower than 400° C. Subsequently, a photoresist film 209 was coated over the entire surface so as to flatten the surface.

Figure 13D:
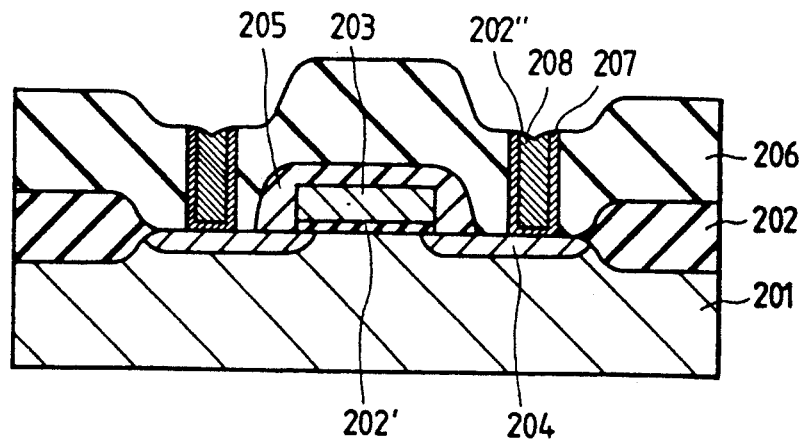

As shown in FIG. 13d, dry etching was applied over the entire surface using SF$_6$ to leave the Tin film 207 and the boron doped amorphous Si film 208 only at the inside of the contact holes h and remove them entirely from other portions. The Tin film 207 may be left to the outside of the contact holes. Rather, if a conductor layer such as Al is formed in the subsequent steps, the TiN film acts as the barrier layer also for the Al film to contribute to the improvement of the reliability. Then, the specimen was dipped into HNO$_3$ heated to 110° C. for one min to form a silicon oxide film 202'' with 1.1 nm thick at the surface of the Si film 208.

Figure 13E:
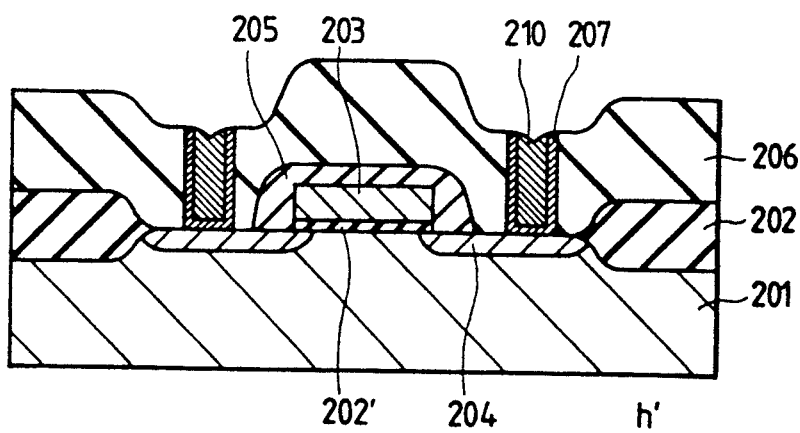

As shown in FIG. 13e, the boron doped amorphous Si film 208 was entirely substituted for the tungsten film 210 by a CVD process using WF$_6$ as a source gas. The CVD conditions were: gas flowrate ratio WF$_6$/N$_2$=20/2000 sccm, the total pressure at 100 Pa and temperature at 300° C. After the substitution, the silicon oxide film 202'' partially left at the surface was removed by an aqueous solution of fluoric acid.

Figure 13F:
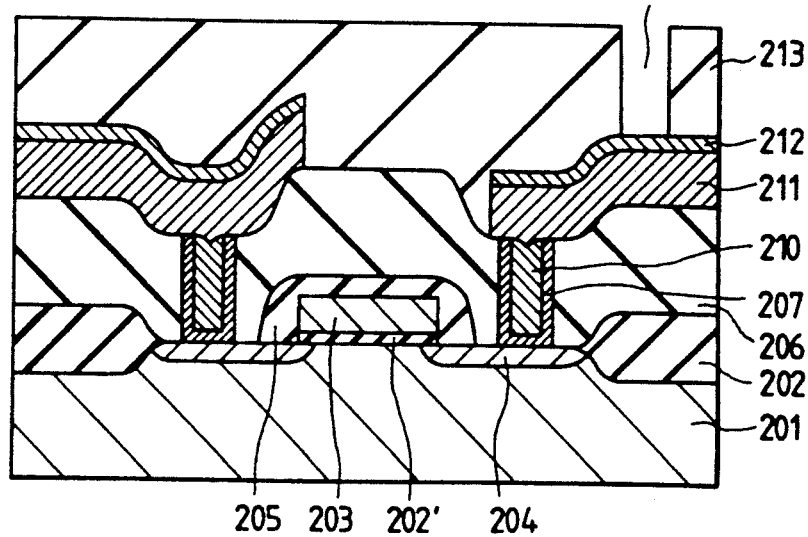

As shown in FIG. 13f, an Al film 211 (500 nm thickness), a molybdenum silicide film 212 (100 nm thickness) were successively deposited and patterned by a well-known photoetching to form an Al wiring and, successively, a lamination film 213 comprising plasma SiO film/SOG (spin on glass) film/plasma SiO film (300 nm/400 nm/300 nm thickness, 1 μm in total) was formed, to which contact holes h' each of 0.5 μm reaching the molybdenum silicide film 212 were formed by using well-known lithography and dry etching technique.

Figure 13G:
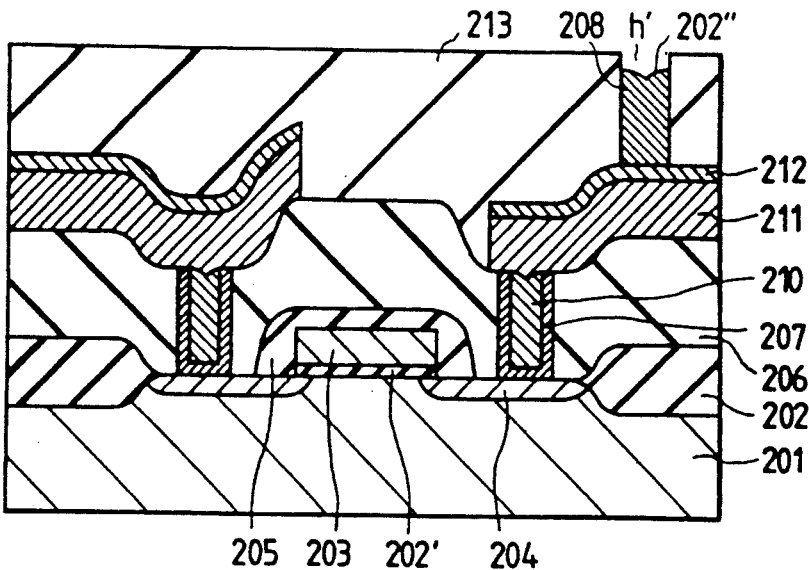

As shown in FIG. 13g, a boron doped amorphous Si film 208 (500 nm thickness) was formed by a low pressure CVD process under the conditions at a reactor temperature of 350° C. and a pressure of 30 Pa. In this case, if the temperature was elevated in excess of 400° C. upto near 500° C., melting of Al wiring resulted. Then, dry etching was applied to the entire surface to leave the amorphous Si film 208 only at the inside of the contact holes h' and remove the same from other portions. Subsequently, the specimen was dipped in HNO$_3$ heated to 110° C. for one min in the same manner as in the step of FIG. 13d, to form a silicon oxide film 202'' of 1.1 nm thickness to the surface of the Si film 208.

Figure 13H:
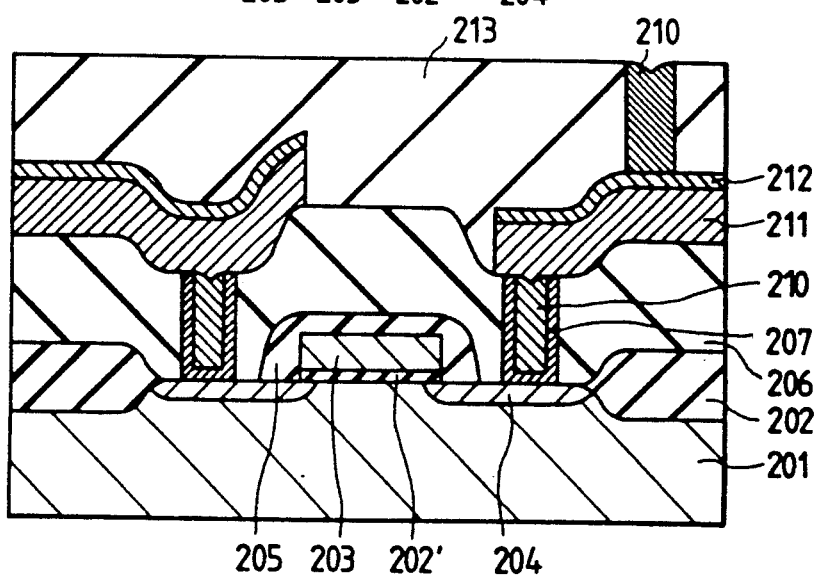

As shown in FIG. 13h, all of the boron doped amorphous Si film 208 was substituted for a tungsten film 210 by a CVD process using WF$_6$. The CVD conditions were: gas flowrate ratio WF$_6$/Ar=20/2000 sccm, total pressure, at 100 pa, temperature at 300° C. The silicon oxide film 202'' partially left at the surface of the tungsten film 210 was removed by dipping an aqueous solution of fluoric acid. Further, the contact holes h' were completely filled with the tungsten film by the conventional CVD process using WF$_6$ and H$_2$. The CVD conditions in this case were: gas flowrate ratio WF$_6$/H$_2$=20/2000 sccm, total pressure at 60 Pa and temperature at 350° C. The reason of using the conventional CVD process with addition of H$_2$ is that 2 mol of the tungsten film is formed from 3 mol of the Si film upon substituting the Si film for the tungsten film as shown in the reaction formula (2) above to result in the reduction of the volume. According to the CVD conditions, tungsten can be deposited selectively only on the tungsten film.

Figure 13I:
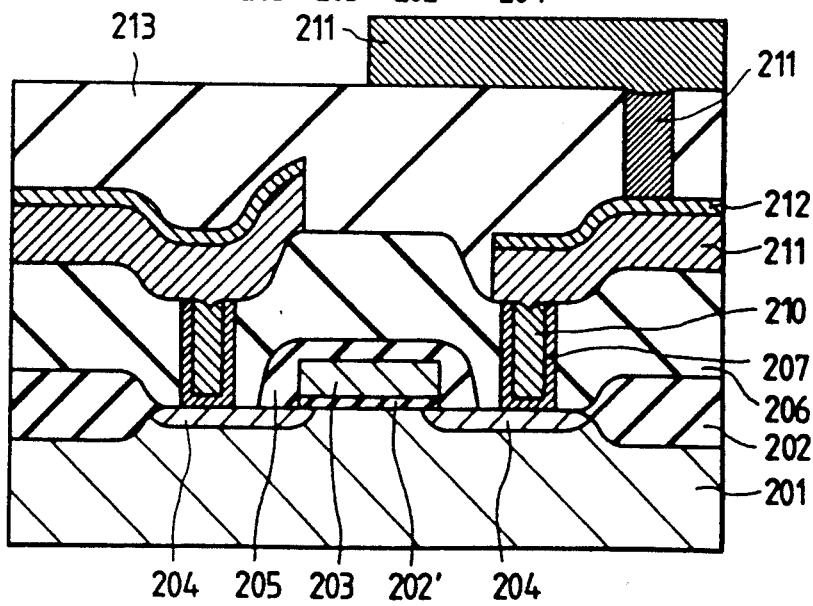

As shown in FIG. 13i, an Al film 211 (900 nm thickness) was formed by sputtering and patterned into a predetermined shape by using a well-known photoetching, to form Al wiring at the second layer.

With this embodiment, contact holes between the Si substrate and the Al wirings, as well as between Al wirings are buried with tungsten to obtain a flat multi level interconnection structure. As a result, problems such as open failure between the Al wirings could be resolved remarkably. Further, contact resistance between the source-drain and the wiring and the contact resistance between the Al wirings were remarkably reduced as compared with the prior art.

Example 10

This embodiment shows an example of using a boron doped amorphous Si film as it is, with no tungsten film substitution, for filling the contact holes.

Figure 14A:
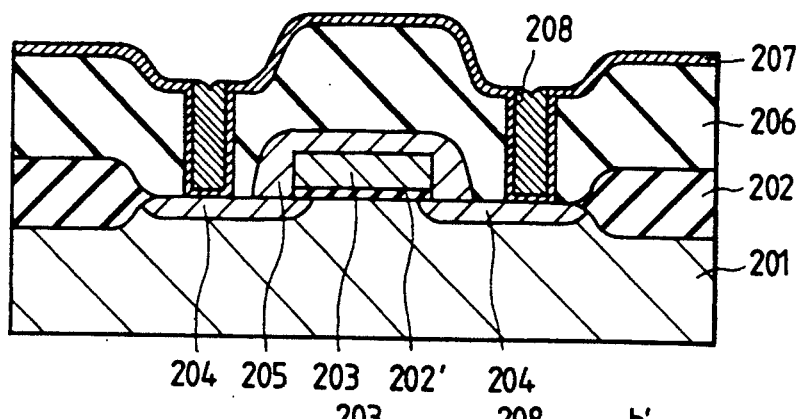
FIG. 14a to 14e are step charts illustrating a further embodiment of the present invention.

A semiconductor device having quite the same cross sectional structure as that in FIG. 13c was formed at first by the same steps as in Example 9. Successively, as shown in FIG. 14a, dry etching was applied over the entire surface by using $SF_6$ to leave the boron doped amorphous Si film 208 only at the inside of the contact holes h and remove the same from other portions. In this embodiment, dry etching was terminated at the instance the TiN film 207 was exposed and the TiN film 207 was left also at the outside of the contact holes.

Figure 14B:
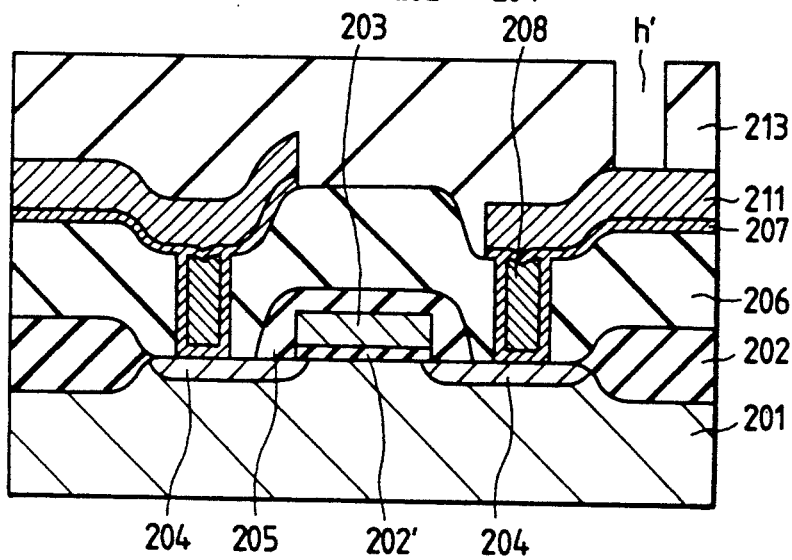

Successively, as shown in FIG. 14b, after forming a TiN film 207 and an Al film 211 in stack, they were patterned into a predetermined shape by well-known lithography and dry etching, to form an Al wiring. A three-layered film 213 comprising plasma SiO film-/SOG film/plasma SiO film (300 nm/400 nm/300 nm thickness respectively) was formed to which a predetermined portion was again etched by a well-known RIE (reactive ion etching) to form contact holes h' each of 0.5 μm diameter reaching the Al film 211.

Figure 14C:
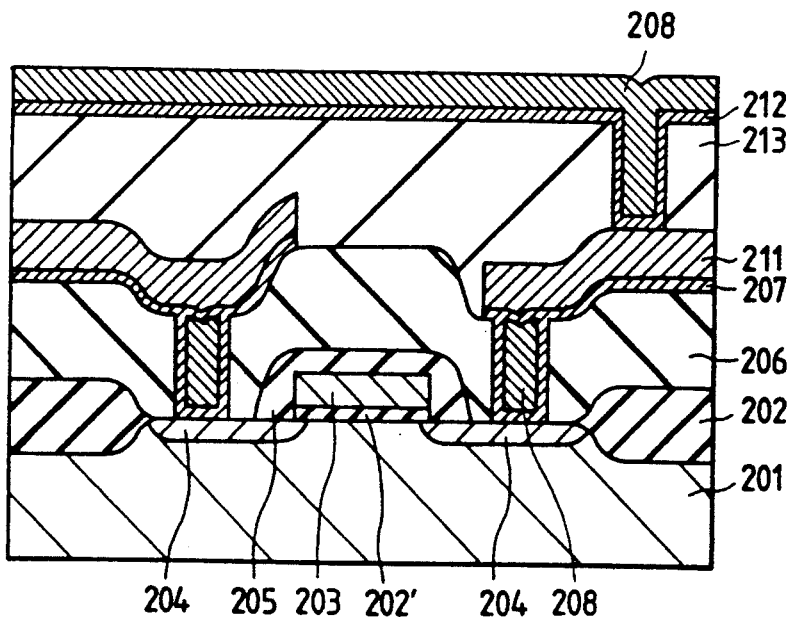

As shown in FIG. 14c, a molybdenum silicide film 212 was formed over the entire surface and, further, a boron doped amorphous Si films (500 nm thickness) 208 was formed by CVD using $Si_2H_6$ and $B_2H_6$ at a temperature of 350° C., and contact holes h' were completely buried.

Figure 14D:
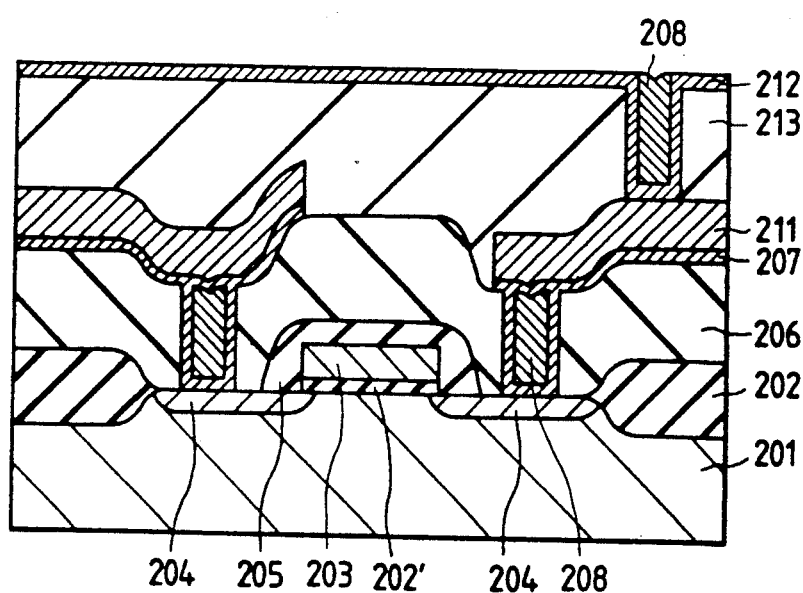

As shown in FIG. 14d, dry etching was applied over the entire surface to leave the boron doped amorphous Si film 208 only at the inside of the contact holes h' and remove the same from other portions.

Figure 14E:
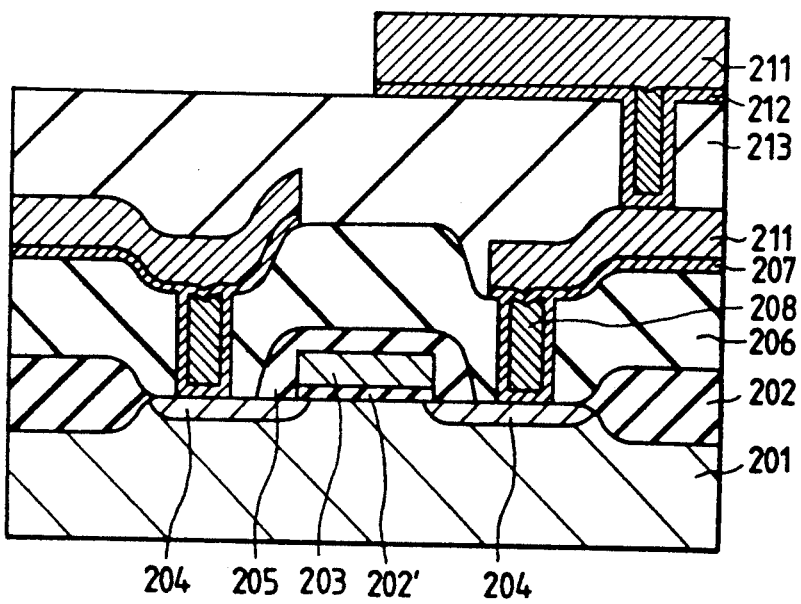

Finally, as shown in FIG. 14e, after forming an Al film 211 (900 nm thickness) by sputtering, the Al film 211 and the molybdenum silicide film 212 were patterned by using known lithography and dry etching technique to form an Al wiring at the second layer.

In this embodiment, since the Si film 208 buried in the contact holes h and h' remained in amorphous states, it scarcely had electroconductivity. What contributes to the electric conduction is the TiN film 207 and the molybdenum silicide film 212 in contact with the Al wiring. Accordingly, the resistivity of the wiring is somewhat higher as compared with the case of Example 9. However, the surface of the multilevel interconnection structure was further flat than in Example 9 and the problem such as open failure of Al wiring on the step was further resolved. In addition, process simplification could also be attained.

Example 11

This embodiment shows an example of forming a tungsten film on a boron doped amorphous Si film to form a W-Si alloy by a subsequent heat treatment.

Specimens 5 and 6 were prepared by the procedures shown in FIG. 15a to 15f. At first, as shown in FIG. 15a, the surface of an Si substrate 601 was thermally oxidized to form an $SiO_2$ film 602 of 100 nm thickness. Then, an Si film was formed and impurities were doped by the following method. In the specimen 5, as shown in FIG. 15b, $Si_2H_6$ and $B_2H_6$ were supplied each at a flowrate of 50 cc/min and 0.5 cc/min simultaneously and a boron doped amorphous Si film 603 of 400 nm thickness was formed under the conditions at 350° C. and 30 Pa. In the specimen 6, after forming a polycrystalline Si film 604 of 400 nm thickness under the conditions at 630° C. and 80 Pa by using $SiH_4$ as a source gas as shown in FIG. 15c, $B^+$ ions 605 were implanted at an implantation energy of 50 KeV and with an implantation dose of $2 \times 10^{16}/cm^2$. Then, a heat treatment was performed for the specimen 6 in a nitrogen atmosphere at 950° C. for 30 min so that the impurity distribution was substantially constant in the direction of the film thickness.

As shown in FIGS. 15d, 15e, a tungsten film 607 of 200 nm thickness was formed by a low pressure CVD process using $WF_6$ and $H_2$ on the boron doped amorphous Si film 603 and the polycrystalline film 606. The conditions in this case were: gas flowrate $WF_6/H_2 = 20/2000$ sccm, temperature at 350° C. and total pressure at 60 Pa. Then, a heat treatment was applied in an $H_2$ atmosphere at 800° C. for 30 min to melt Si into the tungsten film to form a W-Si alloy 608 as shown in FIG. 15f. With this heat treatment, the boron doped amorphous Si film 603 was transformed into the polycrystalline silicon film 606. Finally, unreacted tungsten film was removed with a hydrogen peroxide aqueous solution.

Subsequently, the specimens 5 and 6 were cleaved along the plane in perpendicular to the surface of the Si substrate to observe the surface state of the W-Si alloy and the state of the interface between the W-Si alloy and the Si film by a scanning type electron microscope, and the composition of the alloys by Auger electron spectroscopy, respectively.

As a result, the unevenness at the surface of the specimen 5 in which W-Si alloy was formed comprising the boron doped amorphous Si film, as well as the interface between the Si 606 and the W-Si alloy film 608 were more flat as compared with the specimen 6. It is considered that homogeneous alloying did not occur for the specimen 6 since crystal grains with various crystal orientation were present in the Si film, whereas homogeneous alloying proceeded at the interface between the tungsten film and the Si film since the Si film of the specimen 5 was amorphous. The composition of the alloy formed was about two Si atoms relative to one tungsten atom both in the specimens 5 and 6.

With this embodiment, it was recognized that a W-Si alloy of excellent flatness at the surface and the interface could be formed by forming a tungsten film on a boron doped amorphous Si film formed by CVD using $Si_2H_6$ and $B_2H_6$ and then applying a heat treatment.

Further, although a low pressure CVD process using $WF_6$ and $H_2$ was employed as the method of forming the tungsten film in this embodiment, a low pressure CVD process using $WF_6$ and $SiH_4$ or sputtering process may be used.

In addition, a plurality of species of such gases may be used.

Example 12

This embodiment shows an example of using a boron doped amorphous Si film as programmable interconnections in an integrated circuit and conducting the program by irradiating an energy beam spot to a portion thereof to a polycrystallization.

Figure 16A:
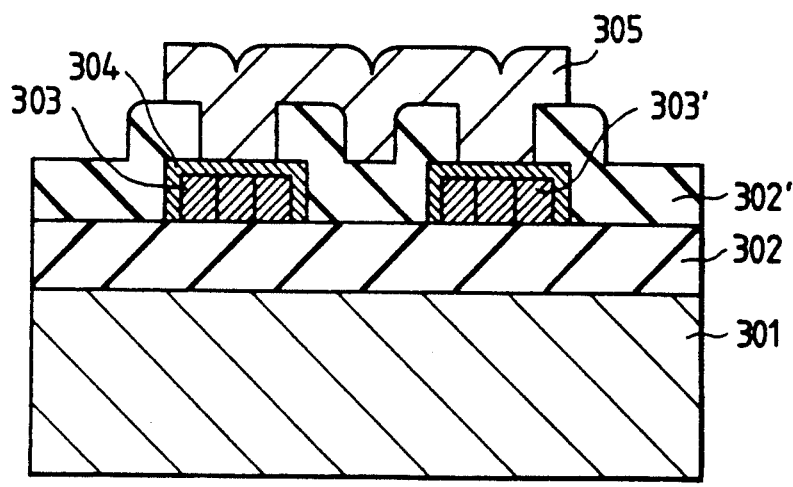
FIGS. 16a and 16b are views illustrating a still further embodiment according to the present invention.
Figure 16B:
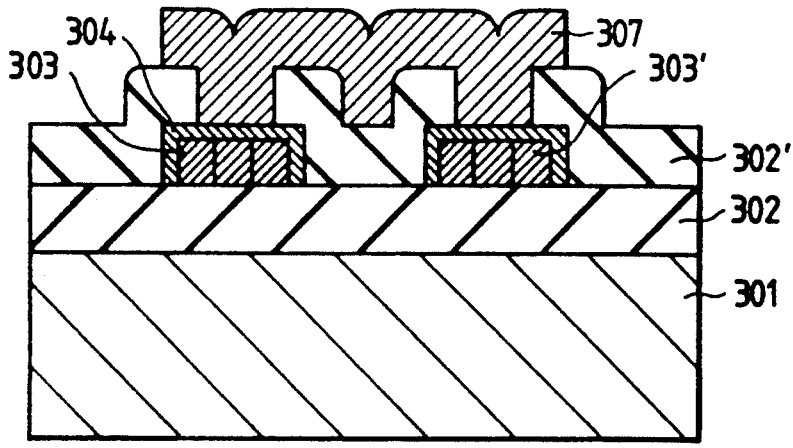

FIGS. 16a, 16b are schematic view illustrating the fundamental concept. As shown in FIG. 16a, Al wirings 303 and 303' were formed on a 3-layered dielectric film 302 comprising plasma $SiO_2$ film/SOG film/plasma $SiO_2$ film on an Si substrate 301. At least one of the Al wirings 303, 303', for example, the Al wiring 303 is connected with a semiconductor device disposed on the Si substrate 301 although not illustrated in FIG. 16a. Three layered film 302' comprising plasma SiO film-/SOG film/plasma SiO film was formed on the wirings and patterned by a well-known lithography and dry etching technique to expose a portion for each of the wirings 303 and 303'. Successively, a boron doped amorphous Si film 305 was formed by a low pressure CVD process by using $Si_2H_6$ and $B_2H_6$ as source gases under the conditions at 350° C. and 30 Pa and the boron doped Si film 305 was patterned by a well-known photoetching.

Since the Si film 305 is amorphous in this stage and the hydrogen concentration in the film is low, the resistivity is extremely high. Accordingly, the Al wirings 303 and 303' are completely insulated from each other. By irradiating a laser beam spot 306 to provide the energy to the Si film 305, the amorphous Si film 305 was transformed into a polycrystalline silicon film 307 as shown in FIG. 16b and, at the same time, impurities doped in the Si film 307 were activated to provide electroconductivity. As a result, the Al wirings 303 and 303' were in electric conduction with each other.

The resistivity of the Si film 303 before the laser irradiation was greater than $10^{10}$ Ω and the Al wirings 303 and 303' were insulated from each other. However, when the laser beam of 1 μm diameter was irradiated for 30 nsec, the Si film 305 was transformed into a polycrystalline Si and the resistivity was reduced to 200 Ω which was $1/10^7$ before the irradiation, by which the Al wirings 303 and 303' were in conduction to each other. The laser energy is about 1/100 to 1/10 of the energy required for melting the Al film or the polycrystalline Si film and scarcely gave effect on the Al film, TiN film, or interlevel dielectric film or the underlying Si substrate. That is, in accordance with this embodiment, a highly resistive material can be converted into a conductor by using an inexpensive laser with low energy and low power. Accordingly, failed circuit or circuit block can be substituted for satisfactory circuit or circuit block by disposing wirings or circuits constituted with the amorphous Si film described above in an integrated circuit and short circuiting predetermined portions by the laser irradiation. As an example, defective bits can be amended by disposing a backup decoder circuit using the film on a decoder circuit in a memory circuit and providing a corresponding backup memory cell. Further, by incorporating the Si film to the decoder circuit itself in the memory circuit, information can be written by short-circuitting under the irradiation of the laser beams.

Further, most of redundancy of memories has been made in the prior art by a method of disconnecting an Si film or Al film by using a high energy laser beam, opening the decoder connected with a defective cell and substituting it for a defect-free cell connected to a dummy decoder. However, since molten polycrystalline Si or Al is connected with the peripheral wirings or the dielectric film is damaged in this method, a sufficient margin is necessary for the lay out to require a large area. However, in accordance with this embodiment, since the Si film or the Al film is not melted, the size of the backup decoder circuit can be reduced. This effect can be promoted further by the feature that the Si film can be formed on the Al wiring.

Although only the short circuit is utilized in this embodiment, since opening is also possible by increasing the energy of the laser irradiation, it will be apparent that the degree of freedom of the wiring can be increased by the combined use thereof. Further, although a laser beam is used as an energy source in this embodiment, an electron beam or ion beam having the same extent of energy may also be used.

In the embodiments 1 to 12 described above, the same effect can also be obtained when the deposition of the boron doped amorphous Si film is conducted at a temperature higher than 200° C. and lower than 400° C. If the film deposition temperature is higher than 400° C., the reaction is put under mass transfer control making it difficult to deposit the Si film under good controllability. Further, the step coverage is reduced to less than 0.9 making it difficult to bury the inside of the groove of a large aspect ratio. If the deposition temperature is lower than 200° C., since the Si film deposition rate is extremely lowered as less than 1 nm/min and the through put is extremely reduced, it can not be applicable to the manufacture of semiconductor devices. Further, in the deposition of the boron doped amorphous Si film, although $Si_2H_6$ was used in the above embodiment as the source gas, the same effect can also be obtained by using $Si_3H_8$. Further, in the embodiments 9 and 10, the same effects can also be obtained by using, as the barrier metal in the contact portion, transition metal element such as Ti or Ta, nitrides or silicides thereof, aluminum nitrides, cobalt silicides and, further, alloy films such as of titanium-tungsten. Further, although BPSG was used for the first layer and the stack film of plasma SiO/SiG/ plasma SiO was used for the second layer as the interlevel dielectric films, the same effect can also be obtained by using PSG or polyimide series heat resistant organic polymeric dielectric film.

According to the present invention, it is possible to form a boron doped Si film of excellent step coverage. Since the activation of the impurities is completed by an annealing at a lower temperature than usual for this Si film, an extremely shallow junction can be formed by using the film as the diffusion source. Further, since it is possible to substitute the thus formed Si film for a tungsten film, Increase for the operation speed and large scale integration of LSI can be attained.

What is claimed is:

1. A method of manufacturing a semiconductor device having electrodes or wirings with excellent step coverage and having a shallow p-type region, comprising steps of introducing at least one of disilane and trisilane, and diborane into a reaction vessel, forming a boron doped amorphous silicon film covering the exposed surface of a semiconductor substrate placed in said reaction vessel by chemical vapor deposition under conditions including a pressure lower than 1 atm and a temperature higher than 200° C. and lower than 400° C., and applying a heat treatment to effect diffusion of the boron from said amorphous silicon film into said semiconductor substrate through said exposed surface thereby forming a shallow p-type region in a surface region of said semiconductor substrate.

2. A method of manufacturing a semiconductor device as defined in claim 1, wherein the p-type region is a source or a drain region of a MOS transistor.

3. A method of manufacturing a semiconductor device as defined in claim 1, wherein the p-type region is an emitter or a base of bipolar transistor.

4. A method of manufacturing a semiconductor device as defined in claim 1, further comprising a step of applying a heat treatment to the amorphous silicon film in an inert atmosphere and transforming it into a polycrystalline silicon film.

5. A method of manufacturing a semiconductor device as defined in claim 4, wherein the temperature for the heat treatment is not higher than 700° C.

6. A method of manufacturing a semiconductor device having electrodes or wirings with excellent step coverage, comprising steps of introducing at least one of disilane and trisilane, and diborane into a reaction vessel and forming a boron doped amorphous silicon film on a surface of a semiconductor substrate placed in said reaction vessel by chemical vapor deposition under the conditions including a pressure lower than 1 atm and a temperature higher than 200° C. and lower than 400° C., wherein the boron doped amorphous silicon film is formed in the opening of a dielectric film formed on the semiconductor substrate and said amorphous silicon in said opening is substituted by tungsten.

7. A method of manufacturing a semiconductor device as defined in claim 6, wherein the substitution with tungsten is conducted by bringing the boron doped amorphous silicon film with a tungsten-containing gas.

8. A method of manufacturing a semiconductor device as defined in claim 7, wherein the tungsten-containing gas is $WF_6$.

9. A method of manufacturing a semiconductor device as defined in claim 6, wherein the boron doped amorphous silicon film is formed on a film selected from the group consisting of transition metal films, nitride or silicide films of transition metals, aluminum nitride films, cobalt silicide films and titanium-tungsten alloy films previously formed on the surface of the semiconductor substrate in the opening.

10. A method of manufacturing a semiconductor device as defined in claim 6, wherein the substitution for tungsten is conducted after forming a film for preventing the nucleation of tungsten on the surface of the amorphous silicon film.

11. A method of manufacturing a semiconductor device as defined in claim 10, wherein the film for preventing the nucleation of tungsten is a silicon dioxide film.

12. A method of manufacturing a semiconductor device as defined in claim 11, wherein the film thickness of the silicon dioxide film is 1 to 3 nm.

* * * * *